United States Patent
Yoon et al.

(10) Patent No.: US 9,537,060 B2
(45) Date of Patent: Jan. 3, 2017

(54) SEMICONDUCTOR LIGHT EMITTING DEVICE PACKAGE

(71) Applicant: Samsung Electronics Co., Ltd., Suwon-si (KR)

(72) Inventors: Chang Bun Yoon, Anyang-si (KR); Sang Hyun Kim, Suwon-si (KR); Min Jung Park, Hanam-si (KR); Jeong Rok Oh, Suwon-si (KR); Chul Soo Yoon, Suwon-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 143 days.

(21) Appl. No.: 14/154,902

(22) Filed: Jan. 14, 2014

(65) Prior Publication Data

US 2014/0264412 A1    Sep. 18, 2014

(30) Foreign Application Priority Data

Mar. 15, 2013  (KR) .......................... 10-2013-0028184

(51) Int. Cl.
*H01L 33/00* (2010.01)
*H01L 33/50* (2010.01)
*H01L 33/46* (2010.01)

(52) U.S. Cl.
CPC ............. *H01L 33/504* (2013.01); *H01L 33/46* (2013.01); *H01L 33/501* (2013.01); *H01L 33/50* (2013.01); *H01L 33/502* (2013.01); *H01L 33/507* (2013.01); *H01L 2224/32245* (2013.01)

(58) Field of Classification Search
CPC ........... H01L 2224/32245; H01L 33/46; H01L 33/50; H01L 33/501; H01L 33/502; H01L 33/507

See application file for complete search history.

(56) References Cited

U.S. PATENT DOCUMENTS

| | | | |
|---|---|---|---|
| 8,008,850 B2 | 8/2011 | Su et al. | |
| 2005/0269582 A1 | 12/2005 | Mueller et al. | |
| 2007/0126017 A1 | 6/2007 | Krames et al. | |
| 2007/0262714 A1 | 11/2007 | Bylsma | |
| 2008/0032142 A1* | 2/2008 | Tasumi et al. | 428/447 |
| 2008/0180018 A1 | 7/2008 | Minamoto et al. | |
| 2009/0015902 A1* | 1/2009 | Powers | E06B 9/24 |
| | | | 359/288 |
| 2011/0025183 A1* | 2/2011 | Su et al. | 313/1 |

(Continued)

FOREIGN PATENT DOCUMENTS

| | | |
|---|---|---|
| JP | 4786886 | 2/2006 |
| JP | 2007-258486 | 10/2007 |

(Continued)

*Primary Examiner* — Su C Kim
(74) *Attorney, Agent, or Firm* — Muir Patent Law, PLLC

(57) ABSTRACT

A semiconductor light emitting device package includes: a light emitting device; a wavelength conversion unit formed in a path of light emitted from the light emitting device and including a mixture of a wavelength conversion material and a glass material; and a reflective film disposed on an upper surface of the wavelength conversion unit and reflecting a partial amount of light emitted from the light emitting device and allowing a partial amount of light emitted from the light emitting device to be transmitted therethrough.

11 Claims, 17 Drawing Sheets

(56) References Cited

U.S. PATENT DOCUMENTS

2012/0012864 A1* 1/2012 Xie .................. H01L 25/0753
                                              257/88
2012/0037882 A1* 2/2012 Yoo et al. ................. 257/13
2012/0107622 A1* 5/2012 Borrelli .................. C03C 8/04
                                              428/428

FOREIGN PATENT DOCUMENTS

| JP | 2009-270091 | 11/2009 |
| JP | 2010-248530 | 11/2010 |
| KR | 10-2009-0000470 | 1/2009 |

* cited by examiner

SEMICONDUCTOR LIGHT EMITTING DEVICE PACKAGE

CROSS-REFERENCE TO RELATED APPLICATIONS

This application claims the priority to, and the benefit of, Korean Patent Application No. 10-2013-0028184 filed on Mar. 15, 2013, with the Korean Intellectual Property Office, the disclosure of which is incorporated herein by reference in its entirety.

BACKGROUND

Technical Field

The present disclosure relates to a semiconductor light emitting device package.

Description of the Related Art

A light emitting diode (LED), a device that converts electricity into light through using the properties of a compound semiconductor thereof, has been variously developed and utilized as a next-generation light source. LEDs are very advantageous in terms of color representation and power consumption, and thus, they have come to prominence as viable light sources for replacing conventional cold cathode fluorescent lamps (CCFLs) used in backlight units (BLUs) of notebook computers, TVs, and the like.

As for methods for implementing desired colors by using light emitting devices, a desired color of light may be implemented by changing types of semiconductor materials used to form a light emitting device or by inducing phosphors to emit light by using a light emitting device.

However, in the case of manufacturing a light emitting device emitting a desired color of light by using these methods, color purity may be degraded in the process of implementing color when a wavelength of light generated by a light emitting device and a wavelength of light converted in phosphors are mixed, or light loss occurs when light is scattered or reflected in phosphors to degrade luminance.

SUMMARY

An aspect of the present disclosure provides a semiconductor light emitting device package having excellent color purity, luminance, and efficiency and capable of implementing a desired color of light.

According to an aspect of the present disclosure, there is provided a semiconductor light emitting device package including: a light emitting device; a wavelength conversion unit positioned on a path along which light generated by the light emitting device travels and configured as a sintered body of a mixture containing a wavelength conversion material and a glass material; and a wavelength selective optical filter disposed on an upper surface of the wavelength conversion unit, reflecting light generated by the light emitting device and allowing light, wavelength converted by the wavelength conversion material, to be transmitted therethrough.

The glass material may be a glass composition including a $ZnO$—$BaO$—$SiO_2$—$P_2O_5$—$B_2O_3$-based main composition and one or more of compositions selected from the group consisting of $Na_2O$, $CaO$, $K_2O$ and $Li_2O$ as an additive.

In one embodiment, a mixing ratio between the wavelength conversion material and the glass material of the mixture may be between 1:20 and 1:6.

The wavelength conversion unit may have an integral total transmittance of a visible light band equal to or greater than 90%.

The wavelength selective optical filter may be an omni-directional reflector (ODR) or a distributed Bragg reflector (DBR). In this case, the wavelength selective optical filter may be formed by alternately laminating two types of dielectric layer having different refractive indices.

Light generated by the light emitting device may be blue light, and the wavelength conversion material may include one selected from the group consisting of a green phosphor, a yellow phosphor, an orange phosphor, and a red phosphor.

The wavelength conversion material may include an orange phosphor, and the wavelength selective optical filter may reflect light having a wavelength band lower than a reference wavelength, allow light having a wavelength band equal to or higher than the reference wavelength, and the reference wavelength may range from about 500 nm to about 550 nm.

Light generated by the light emitting device may be ultraviolet light or a near-ultraviolet light, and the wavelength conversion material may include at least one selected from the group consisting of a green phosphor, a yellow phosphor, an orange phosphor, and a red phosphor.

In one embodiment, the light emitting device is separated from the wavelength conversion unit by a transparent unit. In another embodiment, the light emitting device directly contacts the wavelength conversion unit.

According to another aspect of the present disclosure, a semiconductor light emitting device package includes: a light emitting device; a first wavelength conversion unit positioned on a path along which light generated by the light emitting device travels and configured as a sintered body of a mixture including a first wavelength conversion material and a first glass material; and a first wavelength selective optical filter disposed on a first surface of the wavelength conversion unit, allowing one of light generated by the light emitting device and light having a wavelength converted by the first wavelength conversion material to be transmitted therethrough and reflecting the other of the light generated by the light emitting device and the light having the wavelength converted by the first wavelength conversion material.

Light generated by the light emitting device may be blue light, and the first wavelength conversion material may include a yellow phosphor.

The first wavelength conversion material may include a plurality of phosphors converting light into light having different peak wavelengths. In this case, colors of light emitted from the first wavelength conversion unit may be mixed to provide white light.

The wavelength conversion unit may include a second wavelength conversion unit positioned above the first wavelength conversion unit on the path along which the light generated by the light emitting device travels and configured as a sintered body of a mixture containing a second wavelength conversion material and a second glass material; and a second wavelength selective optical filter disposed on a lower surface of the second wavelength conversion unit, allowing light generated by the light emitting device to be transmitted therethrough and reflecting light having a wavelength converted by the second wavelength conversion material. Each of the first and second wavelength conversion units allows light generated by the light emitting device to be transmitted therethrough, and reflects a second converted light wavelength converted by the wavelength conversion material of the respective wavelength conversion unit positioned thereabove, and the second wavelength selective optical filter additionally allows light converted by the first wavelength conversion material to be transmitted therethrough.

In this case, colors of light emitted from the first and second of wavelength conversion units may be mixed to provide white light.

In another aspect of the present embodiments, a semiconductor light emitting device package includes: a light emitting device; a wavelength conversion unit positioned on a path along which light generated by the light emitting device travels and configured as a mixture containing a wavelength conversion material and a glass material in a respective ratio of between 1:20 and 1:6; and a wavelength selective optical filter disposed on and contacting a first surface of the wavelength conversion unit, reflecting light incident on the filter from one of the light emitting device and the wavelength conversion unit, and transmitting light incident on the filter from the other of the light emitting device and the wavelength conversion unit.

In one embodiment, the wavelength conversion unit is a sintered body positioned between the light emitting device and the filter.

In one embodiment, the filter is positioned between the light emitting device and the wavelength conversion unit; light generated by the light emitting device is a first light; light converted by the wavelength conversion light is a second light that when combined with the first light generates a white light; and the filter allows an amount of the first light to pass through, so that light exiting the semiconductor light emitting package is white light.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
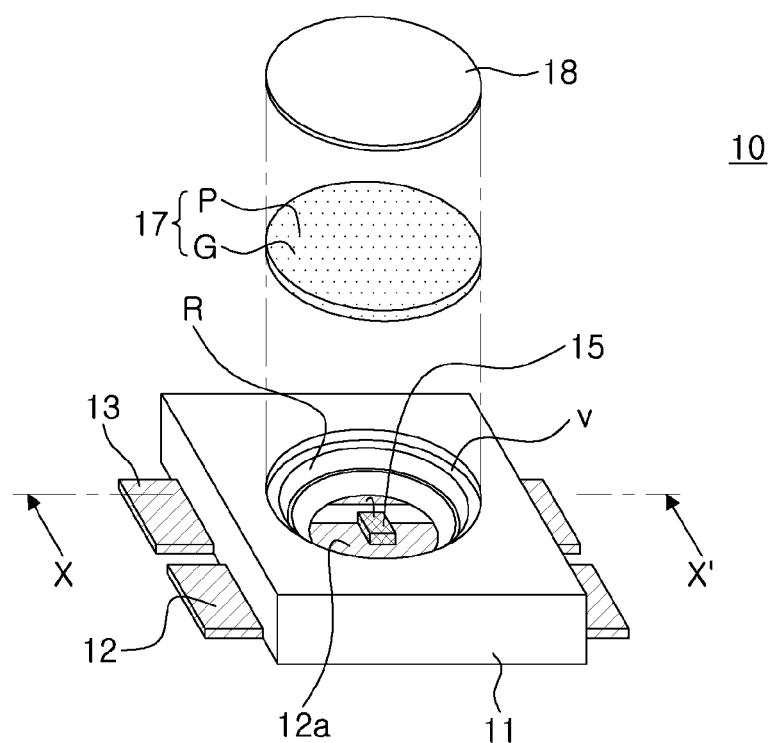
FIG. 1 is a perspective view of a semiconductor light emitting device package according to a first embodiment of the present disclosure.

Embodiments of the present disclosure will now be described in detail with reference to the accompanying drawings. The embodiments may, however, be embodied in many different forms and should not be construed as being limited to the embodiments set forth herein. In the drawings, the shapes and dimensions of elements may be exaggerated for clarity, and the same reference numerals will be used throughout to designate the same or like components.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
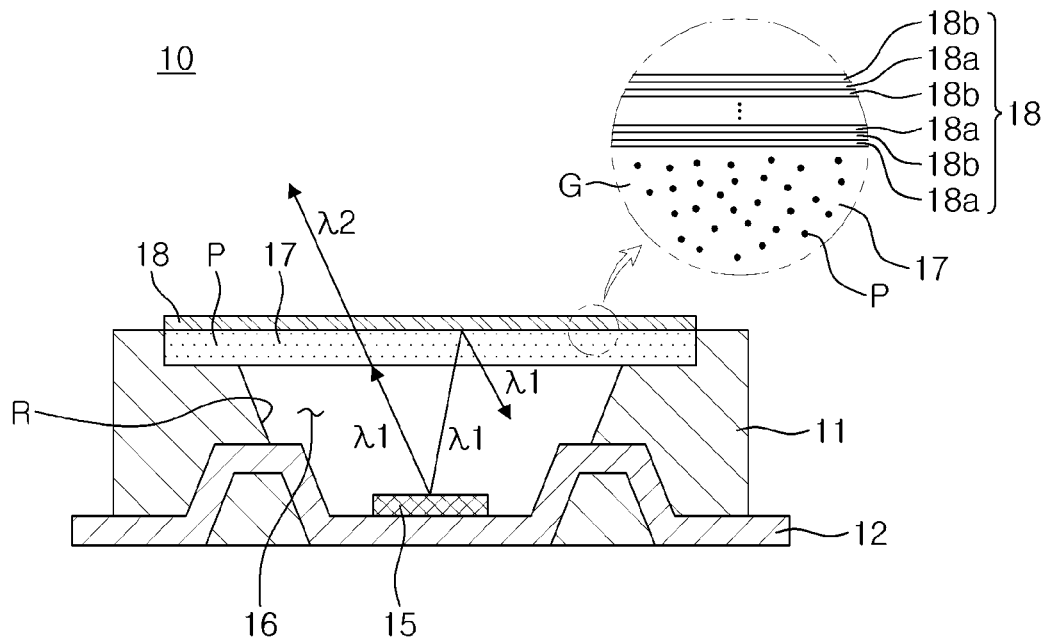
FIG. 2 is an exemplary cross-sectional view of the semiconductor light emitting device package illustrated in FIG. 1.

FIG. 1 is a perspective view of a semiconductor light emitting device package according to a first embodiment of the present disclosure, and FIG. 2 is an exemplary cross-sectional view of the semiconductor light emitting device package illustrated in FIG. 1.

As illustrated in FIG. 1, a light emitting device package 10 according to one embodiment includes a package body 11, a light emitting device 15, a wavelength conversion unit 17, and an optical filter 18.

The package body 11 includes recess portion R with an open upper portion. First and second lead frames 12 and 13 may be coupled by the package body 11 and partially exposed through the recess portion R.

The light emitting device 15 may be electrically connected to the first and second lead frames 12 and 13. As illustrated in FIG. 1, the light emitting device 15 may be mounted on a lower surface 12a formed by bending the first lead frame 12, and may be connected to the second lead frame 13 by a wire. Since the lead frame 12 may have a top and bottom surface (the top surface facing the wavelength conversion unit 17 and optical filter 18, and bottom surface opposite the top surface) lower surface 12a may also be referred to herein as a lower top surface 12a of the lead frame. A transparent unit, such as transparent resin unit 16, may be provided in the recess portion R to cover the light emitting device 15. Although certain elements are illustrated in FIGS. 1 and 2, the structures of the package body 11 and the lead frames 12 and 13 and the connection scheme of the light emitting device 15 as described above may be variously modified.

The light emitting device 15 may include various types of devices such as a semiconductor LED chip, a device as a LED chip installed on a submount substrate, and the like.

The wavelength conversion unit 17 may be positioned on a path along which light from the light emitting device 15 is emitted. In the embodiment depicted in FIGS. 1 and 2, the wavelength conversion unit 17 is positioned on the recess portion R of the package body 11. In order to facilitate disposition of the wavelength conversion unit 17, a stopping protrusion V may be provided in an upper end of the recess portion R of the package body 11 as illustrated in FIG. 1.

In certain embodiments, the wavelength conversion unit 17 may be formed as a sintered body of a mixture containing a wavelength conversion material P and a glass material G.

The wavelength conversion material P may include one or more of various phosphors, such as an inorganic phosphor, or a quantum dot. The wavelength conversion unit 17 may include one or more of a plurality of wavelength conversion materials emitting light having different wavelengths (see, e.g., FIG. 18 and its corresponding description).

In an example, light generated by the light emitting device 15 may be blue light. In this case, in one embodiment, the wavelength conversion material P may include one phosphor selected from the group consisting of a green phosphor, a yellow phosphor, an orange phosphor, and a red phosphor.

The glass material G may serve as a matrix of the wavelength conversion unit 17 or a binder of the wavelength conversion material P. As the glass material G, a material, able to be fired at low temperatures, such that the wavelength conversion material P cannot be degraded at high temperatures, as well as guaranteeing a high degree of light transmittance, may be used.

Hereinafter, a configuration and features of an exemplary wavelength conversion unit 17 employed in the present embodiment will be described in detail.

As the glass material G for the wavelength conversion unit 17, a glass composition, which can be subjected to a low temperature firing process, and capable of obtaining a high degree of light transmittance, may be used. For example, as a glass material of the wavelength conversion unit 17, a $ZnO$—$BaO$—$SiO_2$—$P_2O_5$—$B_2O_3$-based glass may be used, and in order to lower a sintering temperature, a material formed of $Na_2O$, $CaO$, $K_2O$ and $Li_2O$ may be added. Here, it may be understood that $SiO_2$ and $B_2O_3$ are added to the glass material formed of $ZnO$, $BaO$ and $P_2O_5$ to stabilize a phase and the material selected from among $Na_2O$, $CaO$, $K_2O$ and $Li_2O$ may be added to lower a sintering temperature.

In certain embodiments, the glass material G may have a desired composition by mixing 30 wt % to 60 wt % of $ZnO$—$BaO$, 10 wt % to 30 wt % of $B_2O_3$, 5 wt % to 20 wt % of $P_2O_5$ and adding at least one selected from the group consisting of $Na_2O$, $CaO$, $K_2O$ and $Li_2O$ at a rate equal to or less than 20 wt %, but the present inventive concept is not limited thereto.

The glass material G obtained thusly and the wavelength conversion material P may be mixed to form a mixture material having a desired shape (for example, a film-like shape) and sintered.

In one embodiment, the mixture material of the glass material G and the wavelength conversion material P such as a phosphor may be sintered at a temperature ranging from about 500° C. to about 800° C. Since the mixture material is sintered at such a low temperature, a degradation or degeneration of the wavelength conversion material such as a phosphor within the wavelength conversion unit as a sintered body can be prevented, resulting in securing a high degree of reliability.

In order to process the wavelength conversion unit 17 to have a desired thickness or in order to smoothen the surface of the wavelength conversion unit 17, a grinding or polishing process may be additionally performed.

In certain embodiments, the finally obtained wavelength conversion unit 17 may have a thickness ranging from about 50 μm to about 500 μm and density ranging from about 3.0 g/cm³ to about 4.5 g/cm³, but the present inventive concept is not limited thereto. In one embodiment, the wavelength conversion unit 17 is formed to have an integral total transmittance of a visible light band equal to or greater than about 90%.

Optical properties of the wavelength conversion unit can be controlled by a mixture ratio between the glass material and the wavelength conversion material (phosphor). This process will be described in greater detail with reference to FIGS. 7 through 14.

The wavelength conversion unit 17 obtained by sintering a mixture of the glass material G and the phosphor P convert a wavelength of excitation light source into a wavelength of a desired color, while securing a high degree of transmittance.

In one embodiment, as shown in FIGS. 1 and 2, a wavelength selective optical filter 18 is formed on an upper surface of the wavelength conversion unit 17. In this disposition, light generated by the light emitting device 15, passing through the wavelength unit 17, may reach the wavelength selective optical filter 18.

Figure 3:
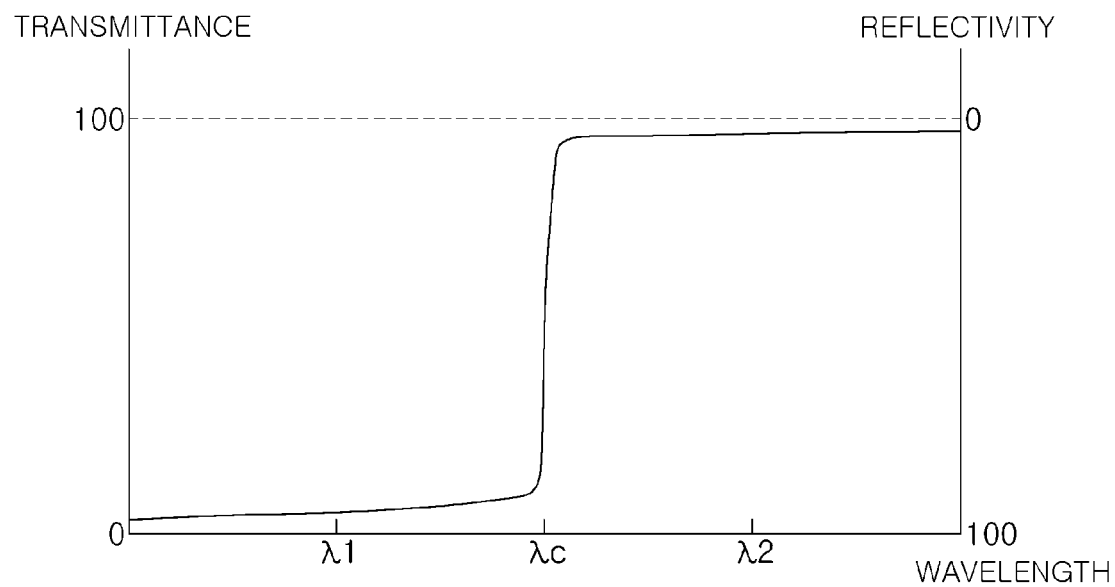
FIG. 3 is a graph schematically showing exemplary transmittance and reflectivity of a reflective layer employed in the first embodiment of the present disclosure.

As illustrated in FIG. 3 the wavelength selective optical filter 18 may be formed to allow light λ1 generated by the light emitting device 15 to be reflected, while allowing light λ2 converted by the wavelength conversion unit to be transmitted therethrough. Namely, the wavelength selective optical filter 18 may be considered as an optical high pass filter cutting off a band lower than a reference wavelength λc. The wavelength selective optical filter 18 may be, for example, an omni-directional reflector (ODR) or a distributed Bragg reflector (DBR). In particular, in one embodiment, the wavelength selective optical filter 18 is an ODR.

As illustrated in FIG. 2, the wavelength selective optical filter 18 may be implemented by alternately laminating first dielectric layers 18a having a predetermined refractive index and second dielectric layers 18b having a refractive index different from that of the first dielectric layer 18a. By appropriately adjusting the refractive indices, thicknesses, and the repeated amounts of laminations of the first and second dielectric layers 18a and 18b, the wavelength selective optical filter 18 may have desired transmittance and reflectivity together with desired wavelength selectivity.

In detail, the first dielectric layer 18a may be made of $SiO_2$, $P_2O_5$, $B_2O_3$ alone or any combination thereof, and the second dielectric layer 18b may be made of $TiO_2$, $Ta_2O_5$, $BaO$, $ZnO$ alone or any combination thereof, but the present inventive concept is not limited thereto. For example, five pairs to twenty pairs of first and second dielectric layers 18a and 18b may be iteratively formed. In one embodiment, the wavelength selective optical filter 18 may have a thickness ranging from about 0.5 μm to about 5 μm.

The operation of the wavelength selective optical filter 18 coupled to the wavelength conversion unit 17 will be described.

As illustrated in FIG. 2, the primary light λ1 emitted by the light emitting device 15 is converted into secondary light having a different wavelength by the wavelength conversion material P of the wavelength conversion unit 17, and the converted secondary light λ2 is transmitted through the optical filter 18 so as to be emitted. Meanwhile, the primary light λ1 not converted by the wavelength conversion unit 17, scarcely transmitted through the optical filter 18, enters again to the wavelength conversion unit 17, increasing a possibility of optical conversion. Through this process, efficiency of conversion into the secondary light λ2 can be enhanced and color purity of light transmitted through the optical filter 18 can be greatly increased.

For example, in a case in which the light emitting device 15 is a blue light emitting device and a wavelength conversion material is an orange phosphor, when a cutoff wavelength λc of the wavelength selective optical filter 18 is designed as a certain wavelength within a range of about 500 nm to about 550 nm therebetween, the wavelength selective optical filter 18 may be able to reflect the blue light λ1, having a relatively short wavelength, by a high degree of reflectivity, while allowing the orange light λ2, having a relatively long wavelength, to be transmitted therethrough. In this manner, since the optical filter 18 allows the converted orange light λ2 to be emitted therethrough and the wavelength conversion unit 17 converts the unconverted blue light λ1 again, this secures a high degree of conversion efficiency even with the relatively small content of wavelength conversion material.

Thus, the conversion efficiency for the content of the wavelength conversion material is increased, and in another aspect, light traveling in the desired light emission direction, namely, light transmitted through the wavelength conversion unit 17 and the optical filter 18 can be significantly increased. These features provide a great advantage in improving purity of monochromatic light.

The optical filter 18 may be applied to the surface of the wavelength conversion unit 17. In this case, in order to prevent a generation of optical noise between the optical filter 18 and the wavelength conversion unit 17, the optical filter 18 may be directly formed on the surface of the wavelength conversion unit 17. For example, in one embodiment, when the optical filter 18 is provided as a material that can be deposited, like a dielectric layer, the optical filter 18 may be directly deposited on the surface of the wavelength conversion unit 17.

In this manner, since the optical filter 18 and the wavelength conversion unit 17 are coupled through a direct deposition process, a disadvantageous optical influence in the interface between the optical filter 18 and the wavelength conversion unit 17 can be excluded. In certain instances, for the purpose of the deposition process, the surface of the wavelength conversion unit 17 may be planarized or smoothened through a polishing process. In this manner, the wavelength conversion unit 17 and the optical filer 18 may be manufactured as a single sheet and the sheet may be cut to fit a region to which the sheet is to be applied, and attached thereto.

In the embodiment shown in FIGS. 1 and 2, when the wavelength conversion unit 17 is positioned on an outer side of the semiconductor light emitting device package 10, the optical filter 18 can prevent the wavelength conversion unit 17 from being in direct contact with the ambient atmosphere and prevent oxidization of the wavelength conversion material P such as a phosphor or a quantum dot or infiltration of hygroscopic moisture, effectively preventing a degradation of reliability. In this manner, since the optical filter 18 is disposed on an upper surface of the wavelength conversion unit 17, reliability of the wavelength conversion unit 17 can be maintained.

In the foregoing first embodiment of the present disclosure, the wavelength conversion unit 17 is disposed on the recess portion R of the package. However, the wavelength conversion unit 17 may be provided in any other appropriate position as long as it is placed in a light emission path, and the position of the wavelength conversion unit 17 may be variously modified according to a package structure.

In different embodiments, the wavelength conversion unit may be provided on a surface of a light emitting device, as well as being positioned on a structure other than the light emitting device. An exemplary embodiment is illustrated in FIG. 4.

Figure 4:
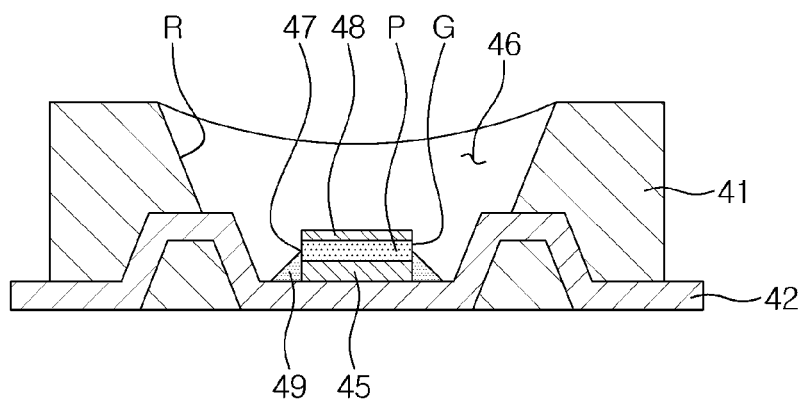
FIG. 4 is a cross-sectional view illustrating a semiconductor light emitting device package according to a second exemplary embodiment of the present disclosure.

FIG. 4 is a cross-sectional view illustrating a semiconductor light emitting device package according to a second exemplary embodiment of the present disclosure.

As illustrated in FIG. 4, a light emitting device package 40 includes a package body 41, a light emitting device 45, a wavelength conversion unit 47, and an optical filter 48.

The package body 41 employed in the embodiment of FIG. 4 may have a recess portion R with an open upper portion, similar to that of the package body 11 illustrated in FIG. 1. Also, one lead frame (not shown) and another lead frame 42 may be coupled by the package body 41, and may be partially exposed through the recess portion R.

The light emitting device 45 is mounted on the lead frame 42, and a transparent unit, such as transparent resin unit 46, may be provided in the recess portion R to cover the light emitting device 45. In certain embodiments, the structures of the package body 41 and the lead frame 42 and the connection scheme of the light emitting device 45 as described above may be variously modified.

The wavelength conversion unit 47 may be positioned on a path along which light from the light emitting device 45 is emitted. In one embodiment, the wavelength conversion unit 47 may be positioned on a surface of the light emitting device 45.

In certain embodiments, the wavelength conversion unit 47 may be formed as a sintered body of a mixture containing a wavelength conversion material P and a glass material G. The wavelength conversion material P may include one or more of various phosphors, such as an inorganic phosphor, or a quantum dot.

The glass material G may serve as a matrix of the wavelength conversion unit 47 or a binder of the wavelength conversion material P. As the glass material G, a material, able to be fired at low temperatures such that the wavelength conversion material P cannot be degraded at high temperatures, as well as securing a high degree of light transmittance, may be used. In one embodiment, the wavelength selective optical filter 48 is formed on an upper surface of the wavelength conversion unit 47. The wavelength conversion unit 47 and the optical filter 48 employed in the present embodiment may be coupled in the same manner as that described above with reference to FIG. 1, unless otherwise mentioned.

The wavelength conversion unit 47 and the optical filter 48 may be manufactured, for example, as a single sheet and attached to a surface of the light emitting device 45 to which they are to be applied, respectively, but the present inventive concept is not limited thereto. The laminate of the conversion unit 47 and the optical filter 48 manufactured as a single sheet, respectively, may be cut to have a design appropriate for the surface of the light emitting device 45. This will be described further with reference to the examples illustrated in FIGS. 5 and 6. Such an attachment process may also be implemented in a wafer level, rather than an individual light emitting device chip unit.

In embodiment depicted in FIG. 4, similar to the first embodiment, the wavelength selective optical filter 48 formed on the wavelength conversion unit 47 allows light, wavelength converted by the wavelength conversion material P of the wavelength conversion unit 47, to be transmitted therethrough and reflects light not converted by the wavelength conversion unit 47 such that it enters the wavelength conversion unit 47 again, thus enhancing overall light conversion efficiency and significantly increasing color purity of light transmitted through the optical filter 48.

Figure 15:
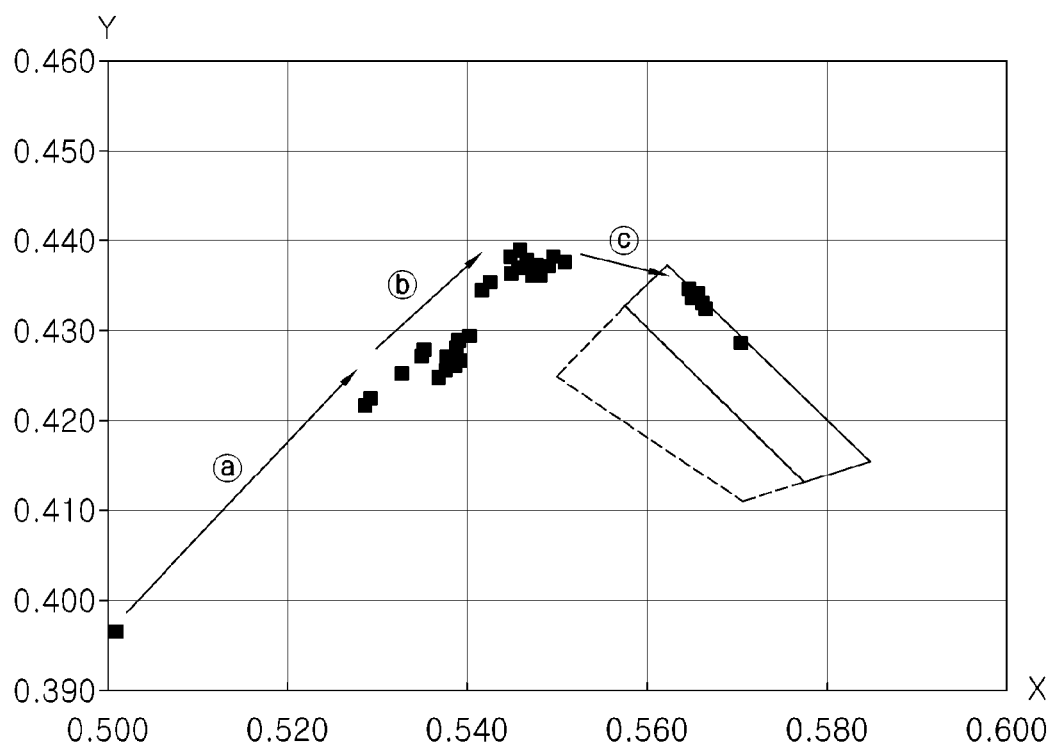
FIG. 15 is a graph showing a change in color coordinates according to a change in an optical filter and other light structure.

When the wavelength conversion unit 47 is applied to the upper surface of the light emitting device 45, light, including unconverted light, may be emitted through the sides of the light emitting device 45, which may make it difficult to obtain high degrees of light conversion efficiency and color purity although the wavelength conversion unit 47 coupled with the optical filter 48 is employed. In order to prevent this from occurring, as illustrated in FIG. 4, a light-reflective material, such as resin 49 containing light-reflective powder may be additionally applied to the lateral surfaces of the light emitting devices. The resin containing the light-reflective powder may prevent light from the light emitting device 45 from being emitted to the lateral surfaces of the light emitting device 45 and may guide light to be emitted through the upper surface of the light emitting device 45 on which the wavelength conversion unit 47 is positioned, whereby the effect expected to be obtained by the presence of the wavelength conversion unit 47 coupled with the optical filter 48 can be sufficiently obtained (please refer to descriptions with reference to FIG. 15, for example). In certain embodiments, as the light-reflective powder, $TiO_2$ powder, $Al_2O_3$ powder, or the like, may be used.

Figure 5:
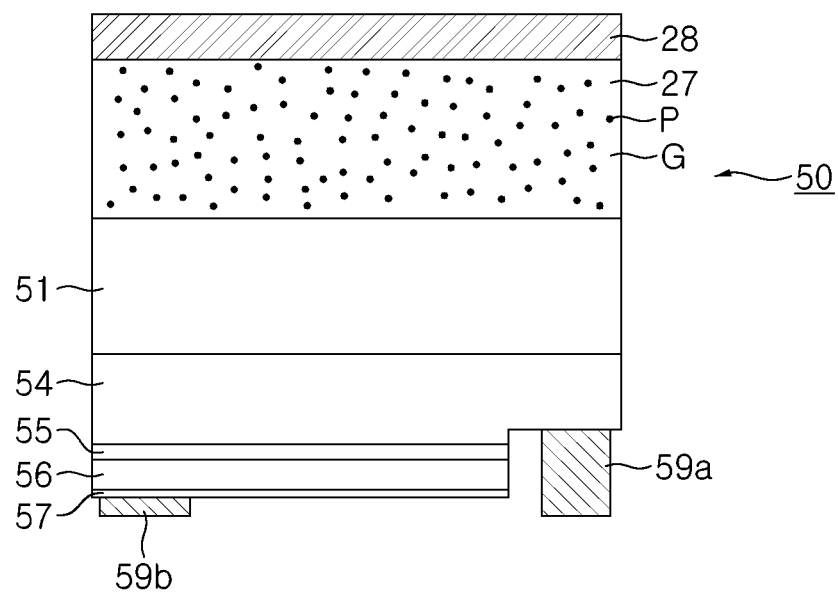
FIGS. 5 and 6 are cross-sectional views illustrating various examples of a semiconductor light emitting device employable in the second embodiment of the present disclosure.
Figure 6:
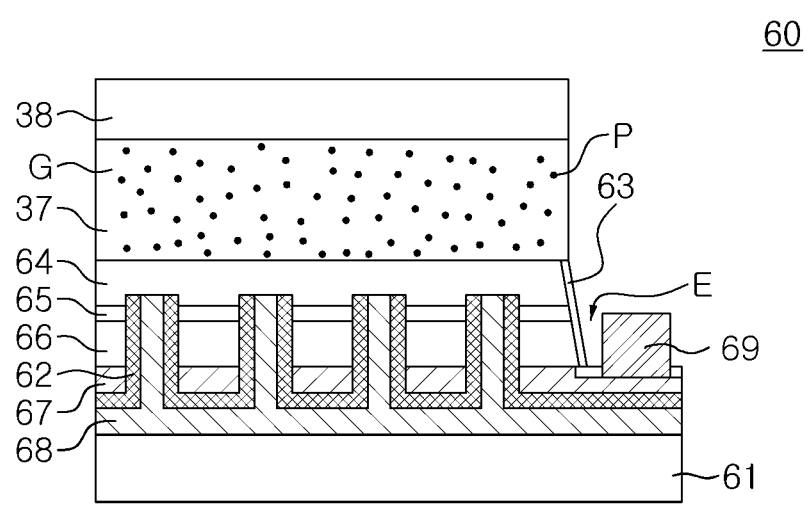

As described above, the wavelength conversion unit and the optical filter may be manufactured as a laminate and cut to have a design appropriate for the surface of the light emitting device, so as to be applied. FIGS. 5 and 6 are cross-sectional views illustrating various examples of a semiconductor light emitting device employable in the second embodiment of the present disclosure.

A semiconductor light emitting diode (LED) chip 50 illustrated in FIG. 5 has a flip-chip structure including a first conductivity-type semiconductor layer 54, an active layer 55, and a second conductivity-type semiconductor layer 56 sequentially formed on a substrate 51. In the flip-chip structure, a highly reflective ohmic-electrode layer 57 may be formed on the second conductivity-type semiconductor layer 56. Also, a first electrode 59a and a second electrode 59b are formed on lower surfaces of the first conductivity-type semiconductor layer 54 and the highly reflective ohmic-contact layer 57, respectively.

In the semiconductor LED chip 50, an upper surface of the substrate 51 (opposite to a surface on which an epitaxial layer, e.g., layer 54, is grown) is provided as a main light emitting surface, and a wavelength conversion unit 27 may be formed on the upper surface of the substrate 51. An optical filter 28 may be formed on the wavelength conversion unit 27.

In one embodiment in which the wavelength conversion unit and the optical filter are provided as a single laminate, it may be cut to have a design appropriate to the upper surface of the substrate 51 and applied. Alternatively, the laminate may be provided to the upper surface of the substrate 51 on a wafer level before being cut into individual chips, and then cut to obtain the LED chip including the laminate of the wavelength conversion unit 27 and the optical filter 28 as illustrated in FIG. 5.

The laminate of the wavelength conversion unit 27 and the optical filter 28 may also be applied to a structure other than the flip-chip LED chip illustrated in FIG. 5. Namely, the LED chip illustrated in FIG. 5 has a structure in which both electrodes are formed on the surface opposite to the main light emitting surface, but even in a structure in which at least one electrode is formed on the main light emitting surface, the laminate of the wavelength conversion unit and the optical filter may also be applied.

A semiconductor LED chip 60 illustrated in FIG. 6 includes a conductive substrate 61, a first electrode 68, an insulating layer 62, a second conductivity-type semiconductor layer 66, an active layer 65, and a first conductivity-type semiconductor layer 64.

The first electrode 68 illustrated in FIG. 6 may be laminated on the conductive substrate 61 and, as illustrated, portions thereof extend to come into contact with the first conductivity-type semiconductor layer 64 through contact holes penetrating through the insulating layer 62, the second electrode layer 67, the second conductivity-type semiconductor layer 66, the active layer 65, and certain regions of the first conductivity-type semiconductor layer 64, whereby the conductive substrate 61 and the first conductivity-type semiconductor layer are electrically connected.

The insulating layer 62 is provided on the first electrode layer 68 in order to electrically insulate the first electrode layer 68 from layers other than the conductive substrate 61 and the first conductivity-type semiconductor layer 64. Namely, the insulating layer 62 is provided between the lateral surfaces of the second electrode layer 67, the second conductivity-type semiconductor layer 66, and the active layer 65, and the first electrode layer 68, as well as between the first electrode layer 68 and the second electrode layer 67. The second electrode layer 67 is formed on the insulating layer 62. As illustrated, the second electrode layer 67 may have a region E exposing a portion of an interface in contact with the second conductivity-type semiconductor layer 66. An electrode pad 69 may be provided in the exposed region E to connect an external power source to the second electrode layer 67. A passivation layer 63 may be formed on the lateral surface of the first conductivity-type semiconductor layer 64, which may be an epitaxial layer.

In this structure, the upper surface of the first conductivity-type semiconductor layer 64 is a main light emitting surface, and the electrode pad 69 may be provided on a surface in the same direction. Thus, the laminate of the wavelength conversion unit 37 and the optical filter 38 may be cut to exclude the exposed region E in which the electrode pad 69 is formed, and may be provided on the upper surface of the first conductivity-type semiconductor layer 64.

In the present embodiment, various other types of LED chips may be employed, and in the various LED chip structures, the laminate of the wavelength conversion unit 37 and the optical filter 38 may be appropriately designed according to a position and formation area of the electrode pad for an external connection, so as to be applied to the main light emitting surface.

Effects of various optical properties obtained from the light emitting device according to the foregoing embodiments were confirmed through various experiments.

Comparative Example 1

An α-SiAlON phosphor and a $ZnO$—$BaO$—$SiO_2$—$P_2O_5$—$B_2O_3$-based glass composition were mixed in a blue LED chip having a wavelength of 445 nm and shaped as a film. And the film was sintered at a temperature of 420° C. The sintered film was polished to prepare a wavelength conversion unit having a thickness equal to 100 μm.

In this case, a mixing ratio (weight ratio) between the α-SiAlON phosphor and the $ZnO$—$BaO$—$SiO_2$—$P_2O_5$—$B_2O_3$-based glass composition were changed into 1/200, 1/100, 1/60, 1/20, 1/15, 1/10, 1/6, and 1/3 to manufacture eight wavelength conversion units, and eight packages having a shape similar to that of the light emitting device package illustrated in FIG. 1 were manufactured.

Embodiment 1

LED packages were manufactured to be similar to that of comparative example 1, and an optical filter was additionally applied to the wavelength conversion unit. Namely, an α-SiAlON phosphor and a $ZnO$—$BaO$—$SiO_2$—$P_2O_5$—$B_2O_3$-based glass composition were mixed in a blue LED chip having a wavelength of 445 nm, shaped as a film, the film was sintered at a temperature of 420° C., and the sintered film was polished to form a wavelength conversion unit having a thickness equal to 100 μm.

Eight wavelength conversion units were manufactured by changing a mixing ratio (weight ratio) between the α-SiAlON phosphor and the ZnO—BaO—SiO$_2$—P$_2$O$_5$—B$_2$O$_3$-based glass composition to 1/200, 1/100, 1/60, 1/20, 1/15, 1/10, 1/6, 1/3, and a wavelength selective optical film cutting off a wavelength equal to or lower than 500 nm was formed. In detail, an SiO$_2$ film having a thickness equal to 25 nm and a TiO$_2$ film having a thickness equal to 10 nm were alternately deposited on the wavelength conversion unit eight times to form an optical film on the wavelength conversion unit. Eight light emitting device packages similar to the package illustrated in FIG. 1 were manufactured.

Figure 7:
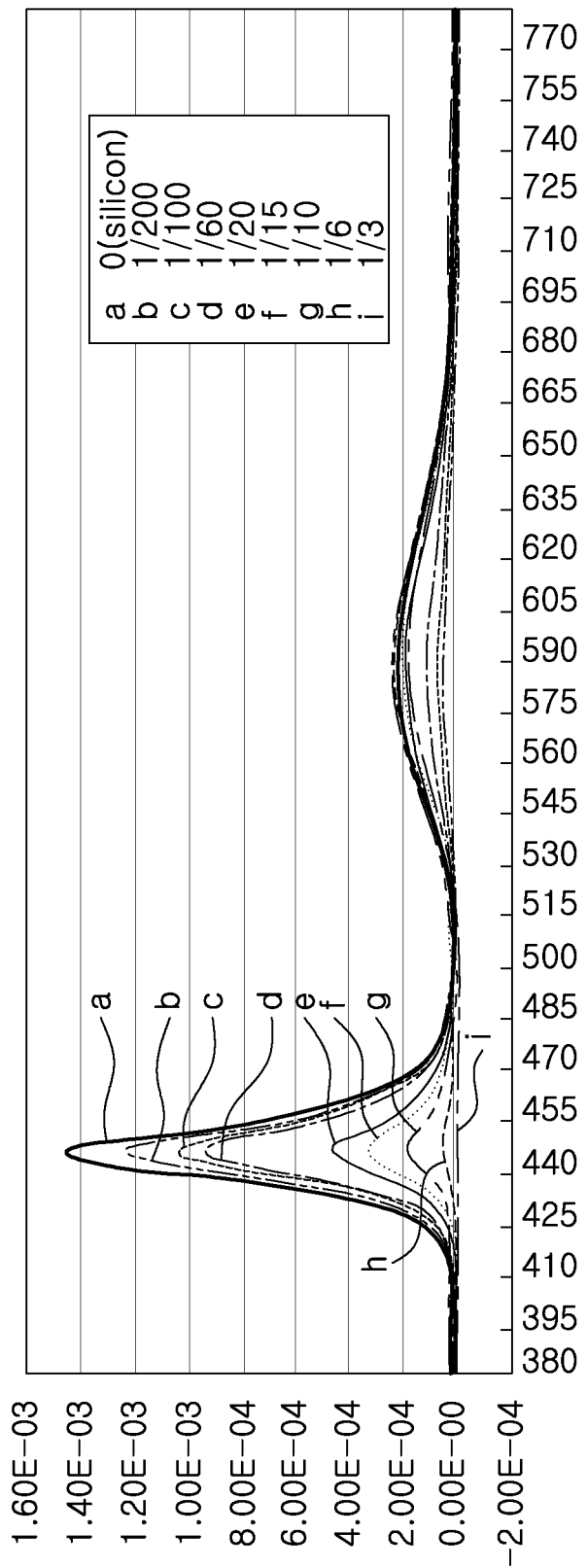
FIG. 7 is a graph showing a change in a light emitting spectrum according to a mixing ratio between an α-SiAlON phosphor employed in a wavelength conversion unit and glass (before an optical filter is applied)
Figure 8:
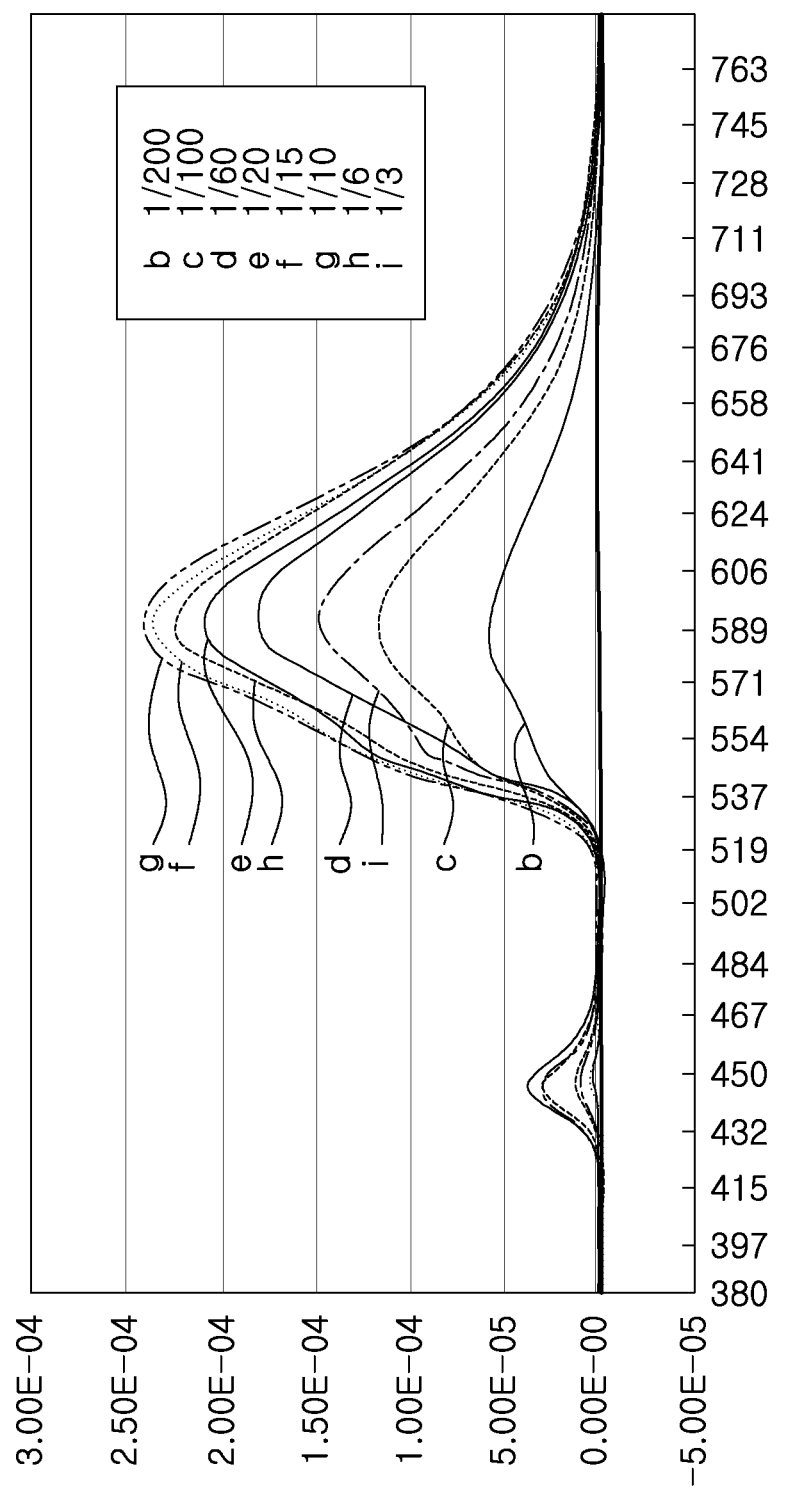
FIG. 8 is a graph showing a change in a light emitting spectrum according to a mixing ratio between an α-SiAlON phosphor employed in a wavelength conversion unit and glass (after the optical filter is applied)

Light emitting spectrums of the light emitting device packages manufactured according to comparative example 1 and embodiment 1 were measured and shown by graphs illustrated in FIGS. 7 and 8.

In case of the LED package according to comparative example 1, as illustrated in FIG. 7, it can be seen that intensity of converted light was slightly increased as the proportion of the phosphor was increased but blue light was dominantly emitted, relative to the converted light, on the whole. Thus, since blue light is greatly mixed, it is difficult to use to implement desired monochromatic light and high color purity cannot be expected.

In comparison, in the case of embodiment 1 in which the optical filter is provided on the wavelength conversion unit, as illustrated in FIG. 8, it can be seen that blue light is drastically reduced in the overall mixing ratio (e.g., as shown in FIGS. 7 and 8, by 90-95% in certain instances). In particular, it can be seen that, as the mixing ratio was increased, the intensity of blue light was significantly reduced and the intensity of converted light was strengthened. Thus, as can be seen, by employing the appropriate optical filter on the wavelength conversion unit according to embodiment 1, desired monochromatic light having a long wavelength was able to be implemented and conversion efficiency was relatively increased as the mixing proportion of the phosphor is increased.

Luminance and color coordinates of the LED packages obtained according to comparative example 1 and embodiment 1 were measured. In particular, in embodiment 1, measurement was performed twice in order to obtain accurate results.

Table 1 shows the results. Also, luminance measured in each package is shown as graphs in FIG. 9, and degrees at which color coordinates (x coordinate variations) of the embodiment 1 (after first application/measurement and after second application/measurement) were changed, in comparison to color coordinates of comparative example 1 (before application) in the same mixing ratio, are illustrated in FIG. 10.

TABLE 1

| Mixing ratio | Before application | | | After first application | | | After second application | | |
| --- | --- | --- | --- | --- | --- | --- | --- | --- | --- |
| | luminance | X color coordinates | Y color coordinates | luminance | X color coordinates | Y color coordinates | Luminance | X color coordinates | Y color coordinates |
| 0 | 0.9340 | 0.1570 | 0.0205 | 0.1810 | 0.2269 | 0.1185 | 0.1040 | 0.1660 | 0.0380 |
| 1/200 | 2.7140 | 0.1890 | 0.0630 | 1.3630 | 0.3380 | 0.2507 | 3.3890 | 0.4490 | 0.3740 |
| 1/100 | 3.6740 | 0.2120 | 0.0932 | 4.1350 | 0.5104 | 0.4445 | 2.9540 | 0.4330 | 0.3550 |
| 1/60 | 5.3140 | 0.2420 | 0.1322 | 5.4500 | 0.5206 | 0.4495 | 5.5930 | 0.5020 | 0.4310 |
| 1/20 | 8.3510 | 0.3440 | 0.2622 | 8.8084 | 0.5314 | 0.4583 | 8.0700 | 0.5290 | 0.4560 |
| 1/15 | 9.3930 | 0.3879 | 0.3155 | 9.1390 | 0.5320 | 0.4608 | 8.6090 | 0.5320 | 0.4570 |
| 1/10 | 9.8200 | 0.4362 | 0.3717 | 9.3550 | 0.5337 | 0.4609 | 8.6840 | 0.5330 | 0.4590 |
| 1/6 | 9.1540 | 0.4973 | 0.4342 | 8.3910 | 0.5405 | 0.4561 | 8.2710 | 0.5410 | 0.4550 |
| 1/3 | 6.8860 | 0.5367 | 0.4541 | 6.4950 | 0.5503 | 0.4470 | 6.3290 | 0.5490 | 0.4470 |

Figure 9:
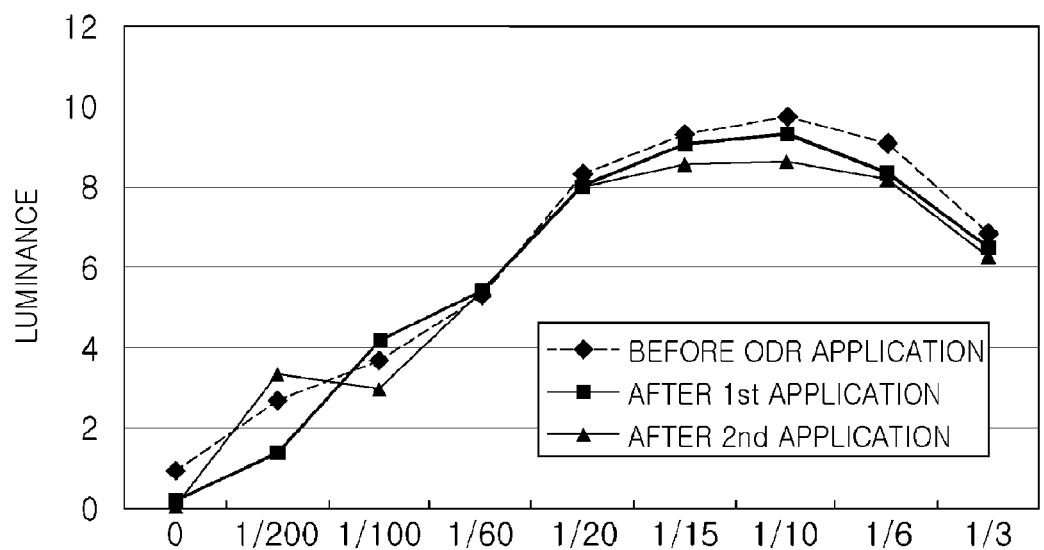
FIG. 9 is a graph showing a change in luminance of light according to a mixing ratio between an α-SiAlON phosphor employed in a wavelength conversion unit and glass (before and after the optical filter is applied)
Figure 10:
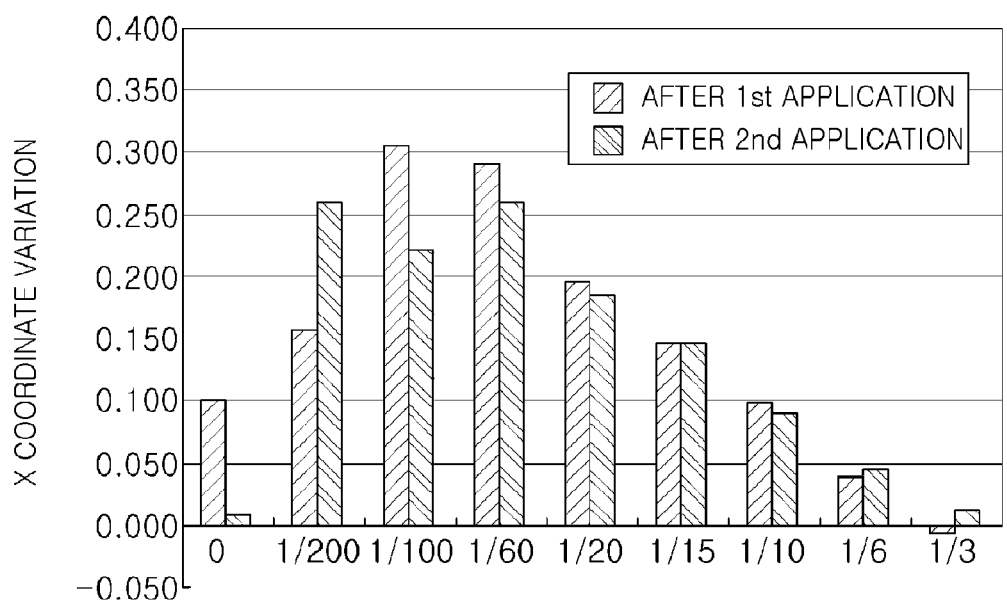
FIG. 10 is a graph showing variations in color coordinates according to a mixing ratio between an α-SiAlON phosphor employed in a wavelength conversion unit and glass (before and after the optical filter is applied)

Referring to FIG. 9 together with Table 1, it can be seen that, in both of a case in which a reflective film is formed on the wavelength conversion unit and a case in which a reflective film is not formed on the wavelength conversion unit, luminance was generally increased as an amount of the phosphor of the wavelength conversion unit was increased, and the luminance tended to be saturated when the mixing ratio between the phosphor and the glass material was 1:20 to 1:6, and was reduced, starting from the mixing ratio of 1:6. This phenomenon may be understood such that, if the proportion of the phosphor is excessively increased, light loss is increased due to light scattering or reflection by the phosphor, reducing luminance.

As shown in Table 1 and FIG. 10, according to the results of checking color coordinates while changing the proportion of the phosphor, in case of comparative example 1 in which an optical filter was not applied to the wavelength conversion unit, an orange color having an X color coordinate and a Y color coordinate as 0.5367 and 0.4561, respectively, was obtained when a mixing ratio between the phosphor and the glass material was 1:3. In comparison, after an optical filter was applied to the wavelength conversion unit, an orange color having X color coordinates and Y color coordinates as 0.5314 and 0.4583 (first measurement) and 0.529 and 0.456 (second measurement) was obtained when the mixing ratio between the phosphor and glass material was 1:20. Thus, it was confirmed that the same chromaticity was able to be implemented with a relatively low phosphor content, by using an optical filter.

In particular, it can be seen that, under the similar color coordinate conditions of the orange color, luminance was 6.886 when the mixing ratio between phosphor and the glass material was 1:3 in the comparative example (before application), while luminance was 8.084 (first measurement) or 8.070 (second measurement) when the mixing ratio between the phosphor and the glass material was 1:20 in the embodiment 1 (after application), which was higher.

Thus, according to the present embodiment 1, desired color coordinates can be implemented with a smaller amount of a phosphor, and a monochromatic orange color with high luminance and color purity can be implemented.

On the basis of the embodiment 1, a desirable mixing ratio between the phosphor and the glass material is 1:60 to 1:6, more preferably, 1:20 to 1:6, but the present inventive concept is not limited thereto.

A similar experiment was conducted with an orange phosphor different from the phosphor used in comparative example 1 and the embodiment 1.

Comparative Example 2

A silicate phosphor and a ZnO—BaO—SiO$_2$—P$_2$O$_5$—B$_2$O$_3$-based glass composition were mixed in a blue LED chip having a wavelength of 445 nm and shaped as a film. And the film was sintered at a temperature of 420° C. The sintered film was polished to prepare a wavelength conversion unit having a thickness equal to 100 μm.

In this case, a mixing ratio (weight ratio) between the silicate phosphor and the ZnO—BaO—SiO$_2$—P$_2$O$_5$—B$_2$O$_3$-based glass composition were changed into 1/200, 1/100, 1/60, 1/20, 1/15, 1/10, 1/6, and 1/3 to manufacture eight wavelength conversion units, and eight packages having a shape similar to that of the light emitting device package illustrated in FIG. 1 were manufactured.

Embodiment 2

LED packages were manufactured to be similar to that of comparative example 2, and an optical filter was additionally applied to the wavelength conversion unit. Namely, a silicate phosphor and a ZnO—BaO—SiO$_2$—P$_2$O$_5$—B$_2$O$_3$-based glass composition were mixed in a blue LED chip having a wavelength of 445 nm, shaped as a film, the film was sintered at a temperature of 420° C., and the sintered film was polished to form a wavelength conversion unit having a thickness equal to 100 μm.

Eight wavelength conversion units were manufactured by changing a mixing ratio (weight ratio) between the silicate phosphor and a ZnO—BaO—SiO$_2$—P$_2$O$_5$—B$_2$O$_3$-based glass composition to 1/200, 1/100, 1/60, 1/20, 1/15, 1/10, 1/6, 1/3, and a wavelength selective optical film cutting off a wavelength equal to or lower than 500 nm was formed. In detail, an SiO$_2$ film having a thickness equal to 25 nm and a TiO$_2$ film having a thickness equal to 10 nm were alternately deposited on the wavelength conversion unit eight times to form an optical film on the wavelength conversion unit. Eight light emitting device packages similar to the package illustrated in FIG. 1 were manufactured.

Figure 11:
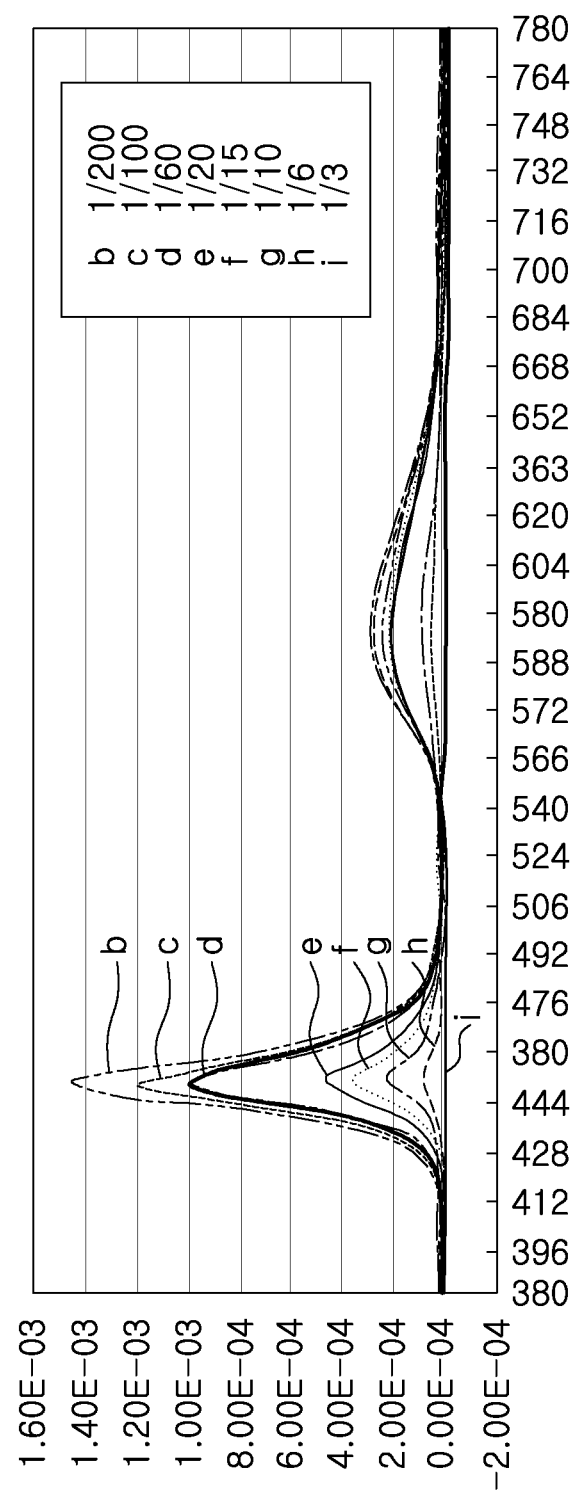
FIG. 11 is a graph showing a change in a light emitting spectrum according to a mixing ratio between a silicate-based phosphor employed in a wavelength conversion unit and glass (before an optical filter is applied)
Figure 12:
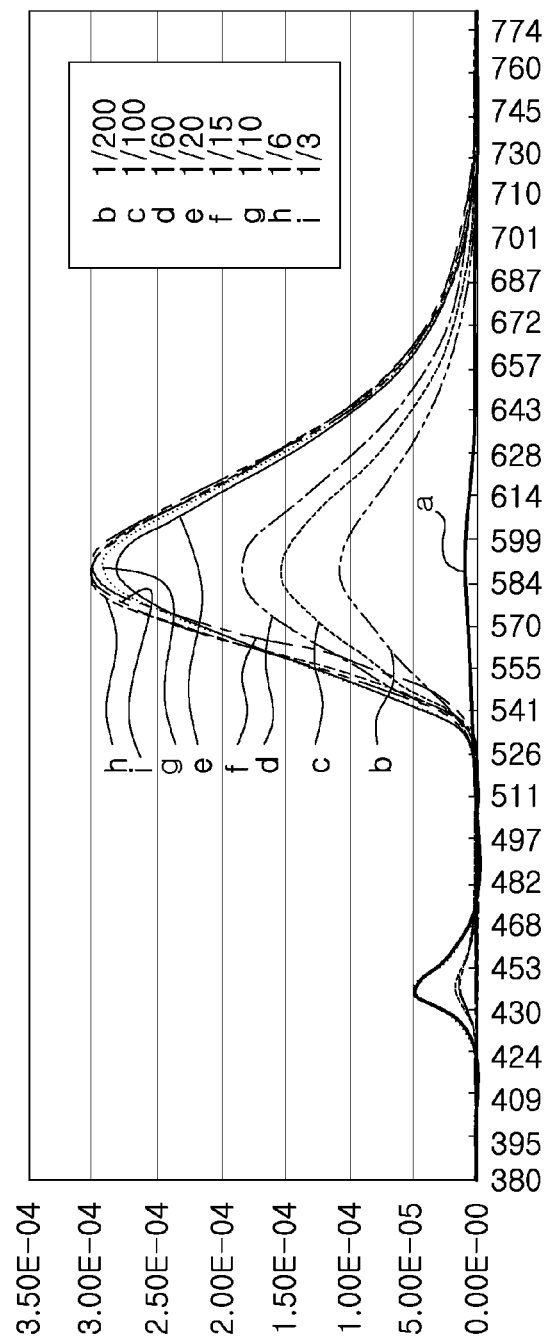
FIG. 12 is a graph showing a change in a light emitting spectrum according to a mixing ratio between a silicate-based phosphor employed in a wavelength conversion unit and glass (after the optical filter is applied)

Light emitting spectrums of the light emitting device packages manufactured according to comparative example and embodiment 2 were measured and shown by graphs illustrated in FIGS. 11 and 12.

In the case of the LED package according to comparative example 2, as illustrated in FIG. 11, it can be seen that the intensity of converted light was slightly increased as the proportion of the phosphor was increased but blue light was dominantly emitted, relative to the converted light, on the whole. Thus, since blue light is greatly mixed, it is difficult to implement desired monochromatic light and high color purity cannot be expected.

In comparison, in the case of embodiment 2 in which the optical filter is provided on the wavelength conversion unit, as illustrated in FIG. 12, it can be seen that blue light is drastically reduced in the overall mixing ratio. In particular, it can be seen that, as the mixing ratio was increased, intensity of blue light was significantly reduced and intensity of converted light is strengthened. Thus, as can be seen, by employing the appropriate optical filter on the wavelength conversion unit according to embodiment 2, desired monochromatic light having a long wavelength was able to be implemented and conversion efficiency was relatively increased as the mixing proportion of the phosphor was increased.

Luminance and color coordinates of the LED packages obtained according to comparative example 2 and embodiment 2 were measured. In particular, in embodiment 2, measurement was performed twice (after application (first), and after application (second)) in order to obtain accurate results. Table 2 shows the results. Also, luminance measured in each package is shown as graphs in FIG. 13, and degrees at which color coordinates (x coordinate variations) of embodiment 2 (after first application and after second application were changed, in comparison to color coordinates of comparative example 2 (before application) in the same mixing ratio, are illustrated in FIG. 14.

TABLE 2

| | Before application | | | After first application | | | After second application | | |
|---|---|---|---|---|---|---|---|---|---|
| Mixing ratio | luminance | X color coordinates | Y color coordinates | luminance | X color coordinates | Y color coordinates | luminance | X color coordinates | Y color coordinates |
| 0 | 1.02 | 0.159 | 0.023 | 0.3548 | 0.256 | 0.147 | 0.279 | 0.194 | 0.067 |
| 1/200 | 3.01 | 0.201 | 0.071 | 3.8138 | 0.520 | 0.428 | 3.213 | 0.447 | 0.351 |
| 1/100 | 4.35 | 0.235 | 0.111 | 5.3227 | 0.524 | 0.434 | 5.221 | 0.504 | 0.412 |
| 1/60 | 5.33 | 0.259 | 0.138 | 6.4827 | 0.529 | 0.437 | 6.081 | 0.499 | 0.404 |
| 1/20 | 8.57 | 0.365 | 0.258 | 9.4320 | 0.546 | 0.446 | 9.214 | 0.530 | 0.432 |
| 1/15 | 9.17 | 0.399 | 0.294 | 9.6302 | 0.549 | 0.445 | 8.547 | 0.545 | 0.445 |
| 1/10 | 9.97 | 0.448 | 0.344 | 9.8461 | 0.551 | 0.444 | 9.526 | 0.550 | 0.445 |
| 1/6 | 10.17 | 0.500 | 0.394 | 9.8313 | 0.555 | 0.442 | 9.455 | 0.556 | 0.441 |
| 1/3 | 9.69 | 0.552 | 0.431 | 9.0246 | 0.565 | 0.432 | 8.754 | 0.565 | 0.433 |

Figure 13:
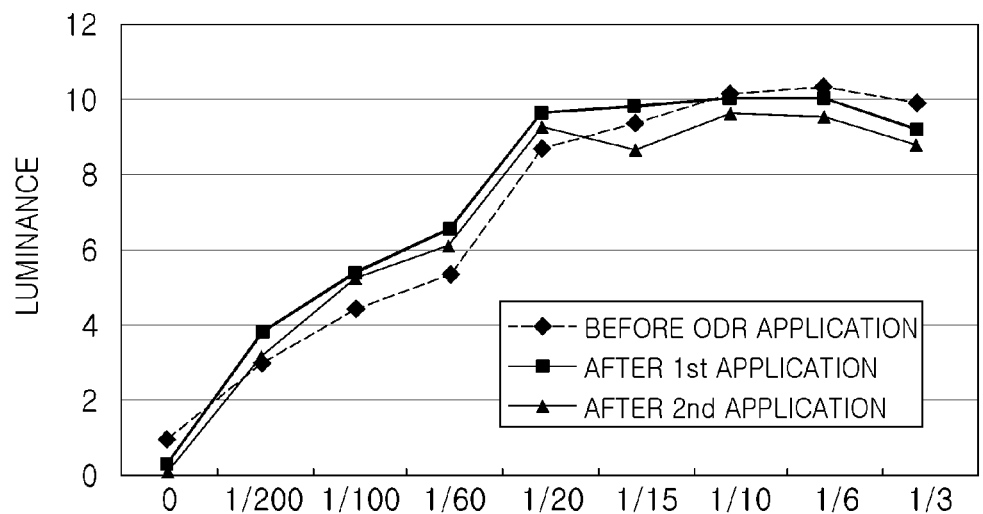
FIG. 13 is a graph showing a change in luminance of light according to a mixing ratio between the silicate-based phosphor employed in a wavelength conversion unit and glass (before and after the optical filter is applied)
Figure 14:
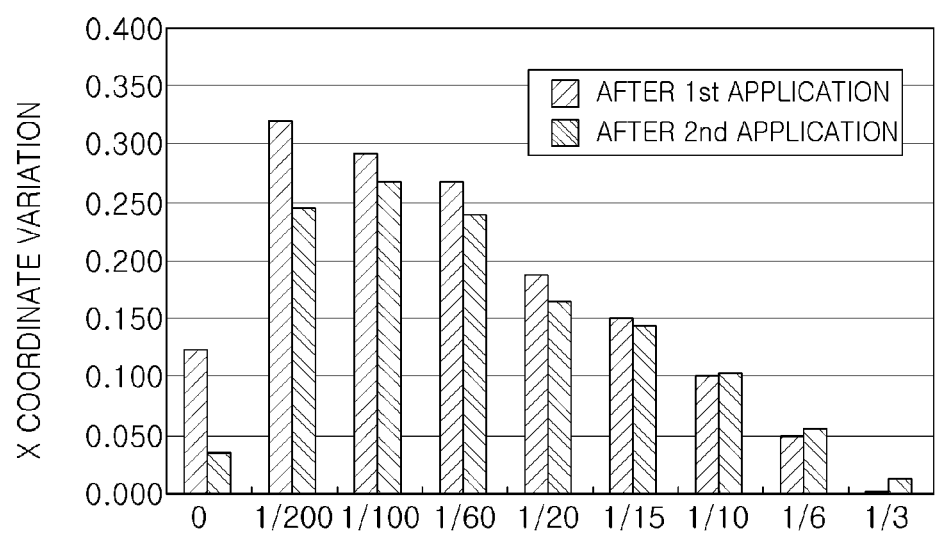
FIG. 14 is a graph showing variations color coordinates according to a mixing ratio between the silicate-based phosphor employed in a wavelength conversion unit and glass (before and after the optical filter is applied)

Referring to FIG. 13 together with Table 2, it can be seen that, in both of a case in which a reflective film is formed on the wavelength conversion unit and a case in which a reflective film is not formed on the wavelength conversion unit, luminance was increased as an amount of the phosphor of the wavelength conversion unit was increased, and the luminance tended to be saturated when the mixing ratio between the phosphor and the glass material was 1:20 to 1:6, and was slightly reduced, starting from the mixing ratio of 1:6 although the amount reduced is smaller than that of embodiment 1. This phenomenon is understood such that, if the proportion of the phosphor is excessively increased, light loss is increased due to light scattering or reflection by the phosphor, reducing luminance.

As shown in Table 2 and FIG. 14, according to the results of checking color coordinates while changing the proportion of the phosphor, in the case of comparative example 2 in which an optical filter was not applied to the wavelength conversion unit, an orange color having an X color coordinate and a Y color coordinate as 0.552 and 0.431, respectively, was obtained when a mixing ratio between the phosphor and the glass material was 1:3. In comparison, after a reflective film was applied to the wavelength conversion unit, a orange color having X color coordinates and Y color coordinates as 0.546 and 0.446 or 0.530 and 0.432 was obtained when the mixing ratio between the phosphor and glass material was 1:20. In this manner, a monochromatic orange color having desired color coordinates having high degrees of luminance and purity can be implemented with a smaller amount of phosphor.

On the basis of embodiment 2, a desirable mixing ratio between the phosphor and the glass material is 1:60 or more, more preferably, 1:20 or more, and in terms of a reduction in the usage amount of phosphor, the mixing ratio is preferably 1:6 or less, but the present inventive concept is not limited thereto.

As described above, in order for a light emitting device package (e.g., 10 of FIG. 1) to transmit a color having desired color coordinates shifted a particular amount from the color coordinates output by a light emitting device (e.g., 15 of FIG. 1), an optimal ratio of phosphors to glass can be selected for the wavelength conversion unit to arrive at the proper wavelength shift amount. In addition, to improve the purity of the desired color and increase luminance of that color, an optical filter can be used.

Hereinafter, cutoff characteristics of the optical filter employed in the embodiments and effects obtained according to a change in another optical structure will be described with reference to embodiment 3.

Embodiment 3

Similarly to embodiment 1, an α-SiAlON phosphor and a ZnO—BaO—SiO$_2$—P$_2$O$_5$—B$_2$O$_3$-based glass composition were mixed in a blue LED chip having a wavelength of 445 nm and shaped as a film. And the film was sintered at a temperature of 420° C. The sintered film was polished to prepare a wavelength conversion unit having a thickness equal to 100 μm. In this case, a mixing ratio (weight ratio) between the silicate phosphor and the ZnO—BaO—SiO$_2$—P$_2$O$_5$—B$_2$O$_3$-based glass composition was set to 1:20, and a light emitting device package was prepared by directly attaching a wavelength conversion unit to an upper surface of the semiconductor LED chip (the flipchip structure illustrated in FIG. 5).

First, the light emitting device package was manufactured and color coordinates thereof were measured without an application of an optical filter. Thereafter, a first optical filter (having a cutoff wavelength of approximately 500 nm) was applied, and changed color coordinates were measured. The changed color coordinates in this process are indicated by in the color space of FIG. 15.

Subsequently, a reflective dam structure was formed with a silicon resin containing TiO$_2$ on the lateral surfaces of the light emitting device, like the package as illustrated in FIG. 4. As a result, as indicated by ⓑ in FIG. 15, primary light emitted from the lateral surfaces of the light emitting device is reduced, a color transfer rate is increased, and color coordinates may be shifted.

Figure 16:
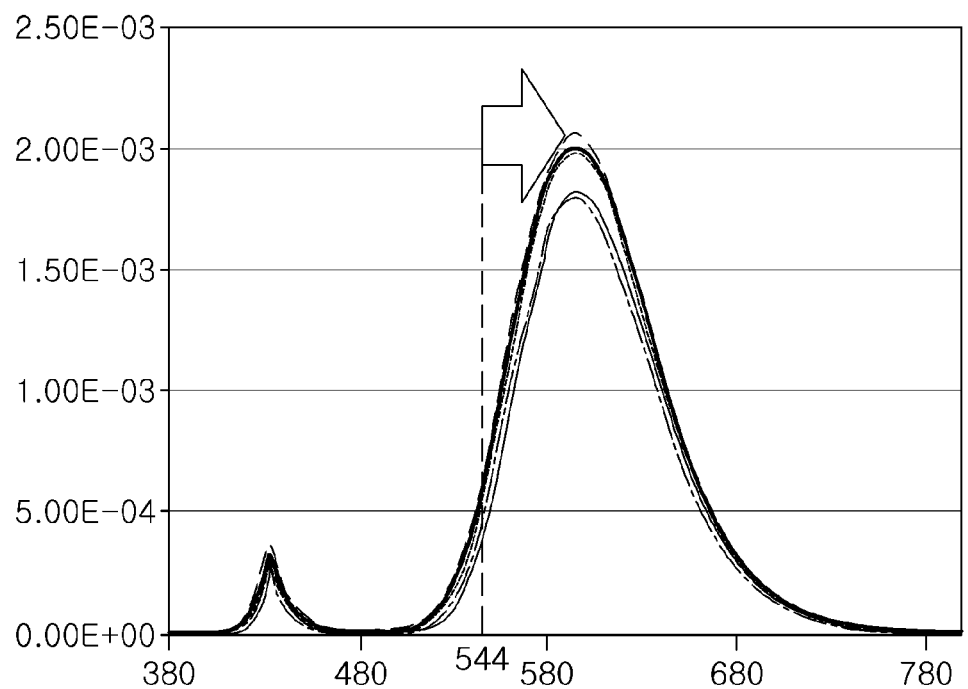
FIG. 16 is a graph showing an effect of improving reliability according to surface coating according to an application of an optical filter.

In addition, when a second optical filter (having a cutoff wavelength of approximately 544 nm) was applied, the color coordinates were shifted to the right lower side so as to be within a desired target region. Here, as illustrated in FIG. 16, the second optical filter has a cutoff wavelength of approximately 544 nm, cutting off even a green band, an orange color having desired color coordinates can be obtained, further increasing color purity.

Figure 17:
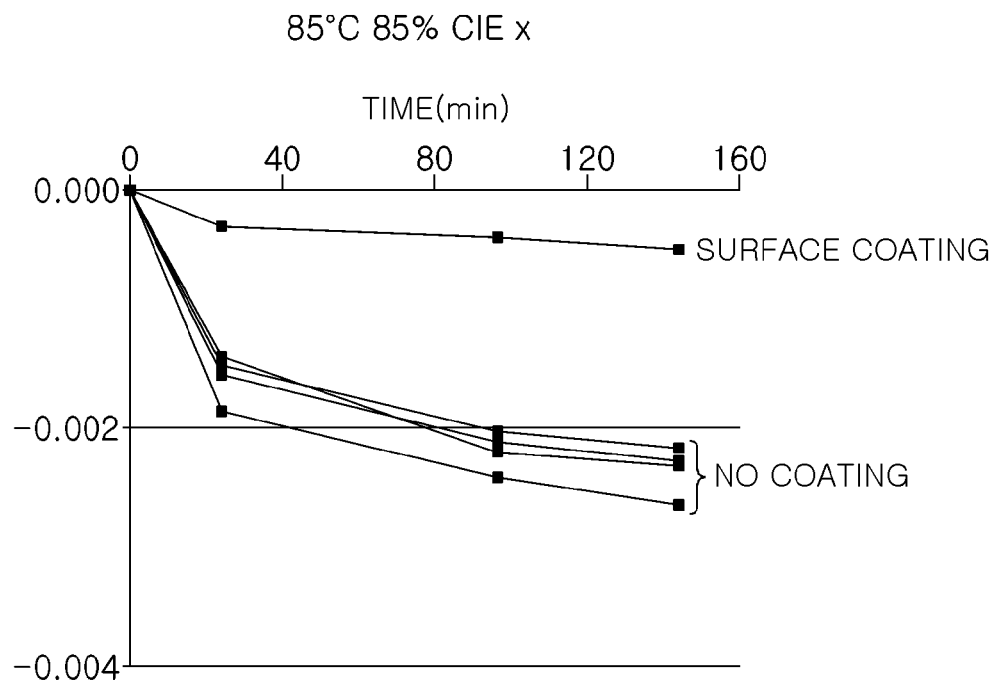
FIG. 17 shows evaluation of reliability of three sample packages according to a first comparative example and a single sample package according to a first embodiment.

FIG. 17 shows evaluation of reliability of three sample packages (having ratios of 1/20, 1/6, and 1/3) obtained according to comparative example 1 and a single sample package (1/6) obtained according to embodiment 1. Reliability of each package was evaluated on the basis of variations of x coordinates according to a temporal change at a temperature of 85° C. and relative humidity of 85% as evaluation conditions. It was confirmed that, In the case of comparative example 1 (surface coating was not applied), a variation of −0.002 or more appeared when 80 minutes elapsed, and in the case of embodiment 1 (surface coating was applied), there was no substantial change in the x coordinate although 80 minutes elapsed and even after 160 minutes elapsed.

This is because, in comparative example 1 without employing an optical filter, the wavelength conversion unit is exposed to ambient atmosphere. Namely, a phosphor of the wavelength conversion unit is in contact with ambient atmosphere so as to be easily oxidized, changing the color coordinates, while in the case of embodiment 1, the optical filter serves as a protective coating on the surface of the wavelength conversion unit, effectively preventing a phosphor of the wavelength conversion unit from being oxidized.

In the former embodiment, the configuration of employing a monochromatic phosphor, like the orange phosphor, has been described as an example, but phosphors emitting various other colors or a different type of wavelength conversion material such as a quantum dot may also be used. A plurality of wavelength conversion materials converting light into light having a different peak wavelength may be employed. In one embodiment, two types of wavelength conversion materials may be used to implement white light. This embodiment is illustrated in FIG. 18.

Figure 18:
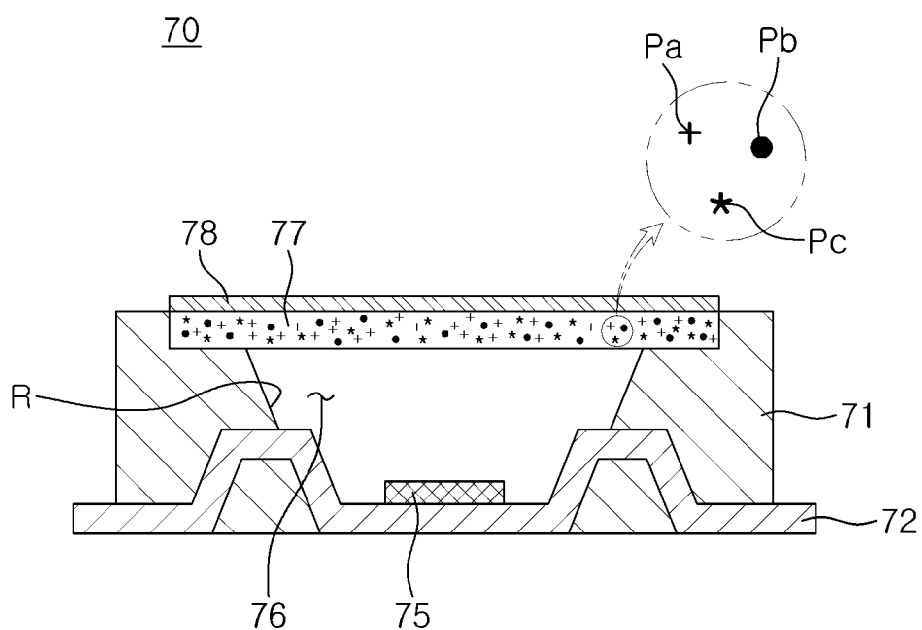
FIG. 18 is a cross-sectional view of a semiconductor light emitting device package according to a third exemplary embodiment of the present disclosure.

FIG. 18 is a cross-sectional view of a semiconductor light emitting device package according to a third exemplary embodiment of the present disclosure.

A semiconductor light emitting device package 70 illustrated in FIG. 18 includes a package body 71, a light emitting device 75, a wavelength conversion unit 77, and an optical filter 78.

The package body 71 employed in the present embodiment may have a recess portion R with an open upper portion, like the package body of the former embodiment. Also, one lead frame (not shown) and another lead frame 72 may be coupled by the package body 71, and may be partially exposed through the recess portion R.

The light emitting device 75 is mounted on the lead frame 72, and a transparent layer, such as transparent resin unit 76 may be provided in the recess portion R to cover the light emitting device 75. Although depicted and described in a certain manner, the structures of the package body 71 and the lead frame 72 and the connection scheme of the light emitting device 75 as described above may be variously modified.

The wavelength conversion unit 77 may be provided in an upper end of the recess portion R so as to be positioned on a path along which light from the light emitting device 75 is emitted. In one embodiment, the wavelength conversion unit 77 may be formed as a sintered body of a mixture containing a wavelength conversion material P and a glass material G.

The wavelength conversion material P may be various phosphors such as an inorganic phosphor, or a quantum dot.

In the present embodiment, the wavelength conversion material P includes three phosphors Pa, Pb, and Pc having different peak wavelengths, respectively, rather than including a monochromatic phosphor.

As the glass material G, any material may be used. In certain embodiments, the material used is able to be fired at low temperatures so that the wavelength conversion material P cannot be degraded at high temperatures. The material used may also secure a high degree of light transmittance. The wavelength conversion unit 77 and the optical filter 78 employed in the present embodiment may be coupled in the same manner as that described above with reference to FIG. 1, unless otherwise mentioned.

Also, in the present embodiment, similarly to the former embodiment, the wavelength selective optical filter 78 may be formed on an upper surface of the wavelength conversion unit 77. The wavelength selective optical filter 78 formed on the upper surface of the wavelength conversion unit 77 may allow light to be selectively transmitted or reflected according to wavelengths.

Namely, the light emitting device 75 emits primary light (having a peak wavelength of $\lambda 1$) provided as excitation light. The primary light is converted into three types of secondary light (having peak wavelengths $\lambda 2a$, $\lambda 2b$, and $\lambda 2c$) having different wavelengths by the three phosphors Pa, Pb, and Pc of the wavelength conversion unit 77. The converted three types of secondary light have a long wavelength, relative to the primary light. In one embodiment, the optical filter 78 is designed as a high pass filter having a cutoff wavelength between the wavelength $\lambda 1$ of the primary light and a wavelength of light, having the shortest wavelength, among the three types of secondary light.

Figure 19:
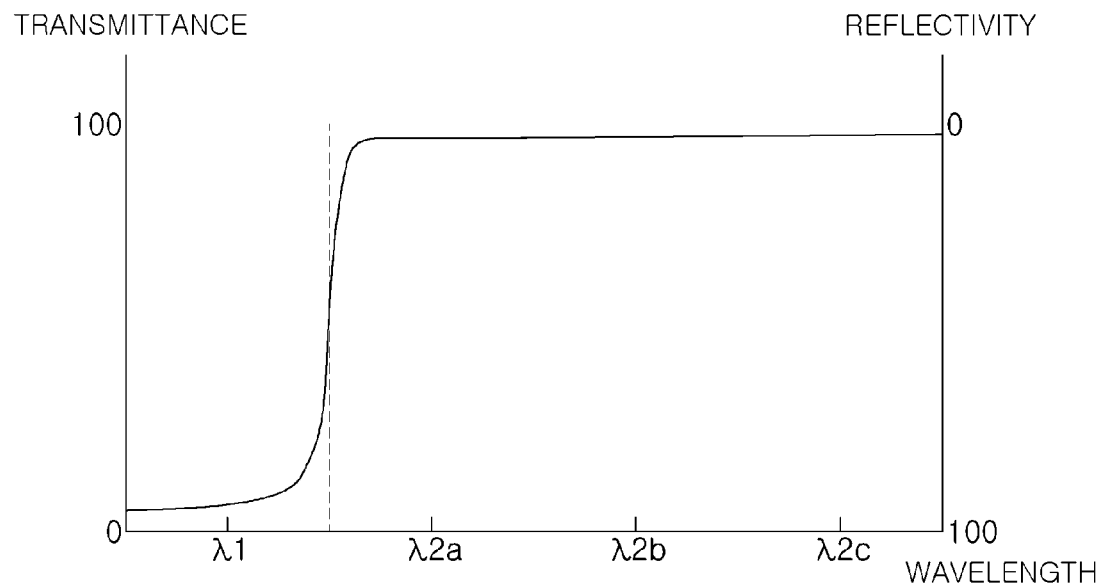
FIG. 19 is a graph schematically showing exemplary transmittance and reflectivity of a reflective layer employed in the third embodiment of the present disclosure.

Thus, as illustrated in FIG. 19, the optical filter 78 reflects the primary light (having a peak wavelength of $\lambda 1$) emitted from the light emitting device 75 such that it does not travel to the outside, and light not converted in the wavelength conversion unit 77 is reflected to enter again the wavelength conversion unit 77, increasing conversion efficiency. Through this process, the overall light conversion efficiency can be enhanced.

Meanwhile, unlike the former embodiment, in the present embodiment, the plurality of different phosphors Pa, Pb, and Pc are used in the wavelength conversion n unit 77. Primary light emitted from the light emitting device 75 may be converted into a plurality of types of secondary light having different wavelength bands, and the plurality of phosphors Pa, Pb, and Pc and an excitation light source (namely, wavelength conditions of the light emitting device 75) may be selected such that white light can be implemented through combination of the plurality of types of secondary light.

For example, ultraviolet light or near ultraviolet light may be selected as primary light generated by the light emitting device 75 and three phosphors, i.e., a blue phosphor, a green phosphor, and a red phosphor, may be selected as the wavelength conversion materials to provide desired white light.

Alternatively, a conversion color combination of phosphors and wavelength conversion materials may be variously implemented. In another example, white light may be implemented through various combinations such as a combination of blue and yellow phosphors, an additional combination of at least one of a green phosphor, an orange phosphor, and a red phosphor to blue and yellow phosphors, and the like.

In case of implementing white light through a combination of a plurality of phosphors, the conversion efficiency can be enhanced by using the optical filter, so the amount of phosphors used in the wavelength conversion unit can be advantageously reduced in actuality.

In one embodiment, in a particular example of implementing white light emission, white light may be implemented only with a monochromatic phosphor of a yellow phosphor by slightly increasing transmittance of a blue color of an optical filter, while using a blue light emitting device, rather than an ultraviolet or near-ultraviolet light emitting device. The white light may be implemented by allowing a sufficient amount of transmittance of the blue color to result in a white light when combined with the transformed yellow light.

Also, the wavelength conversion unit 77 and the optical filter 78 may be manufactured as a single sheet and attached to the package body 71 to cover the recess portion R, but the present inventive concept is not limited thereto.

The optical filter employed in the foregoing embodiment acts as a high pass filter, but the optical filter may also be implemented to act as an optical low pass filter.

When the optical filter is employed as an optical high pass filter as in the foregoing embodiment, it is disposed in a next stage of the wavelength conversion unit in an optical path in order to allow only converted light to be transmitted therethrough and unconverted light to be reflected. However, in a case in which an optical low pass filter is employed as the optical filter, the optical low pass filter is disposed in a front stage of the wavelength conversion unit, i.e., between an excitation light source and the wavelength conversion unit, in an optical path in order to allow only converted light to be transmitted and unconverted light to be reflected. This embodiment will be described with reference to FIGS. 20 through 26.

Figure 20:
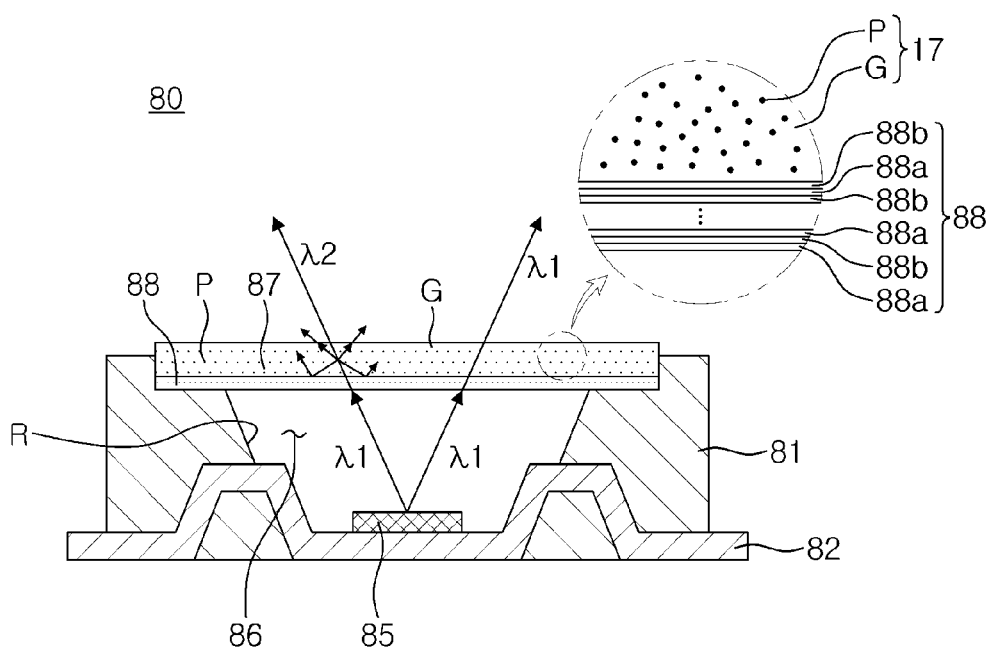
FIG. 20 is a cross-sectional view of a semiconductor light emitting device package according to a fourth exemplary embodiment of the present disclosure.

FIG. 20 is a cross-sectional view of a semiconductor light emitting device package according to a fourth exemplary embodiment of the present disclosure.

A semiconductor light emitting device package 80 illustrated in FIG. 20 includes a package body 81, a light emitting device 85, a wavelength conversion unit 87, and an optical filter 88.

The package body 81 employed in the present embodiment may have a recess portion R with an open upper portion, like the package body of the former embodiment. Also, one lead frame (not shown) and another lead frame 82 may be coupled by the package body 81, and may be partially exposed through the recess portion R.

The light emitting device 85 is mounted on the lead frame 82, and a transparent resin unit 86 may be provided in the recess portion R to cover the light emitting device 85. In one embodiment, the structures of the package body 81 and the lead frame 82 and the connection scheme of the light emitting device 85 as described above may be variously modified. The wavelength conversion unit 87 may be provided in an upper portion of the recess portion R so as to be positioned on a path along which light from the light emitting device 85 is emitted. In the present embodiment, the wavelength conversion unit 87 may be formed as a sintered body of a mixture containing a wavelength conversion material P and a glass material G. A mixing ratio between the wavelength conversion material P (phosphor) and the glass material G may be, for example, 1:9 to 6:4, and may be generally set to be higher than those of the former embodiment.

The wavelength conversion material P may be various phosphors such as an inorganic phosphor, or a quantum dot. As the glass material G, a material, able to be fired at low temperatures such that the wavelength conversion material P cannot be degraded at high temperatures, as well as securing a high degree of light transmittance, may be used. In this manner, the wavelength conversion unit 87 obtained by sintering the mixture of the glass material G and the phosphor P can convert a wavelength of an excitation light source into a wavelength of a desired color, while securing a high degree of transmittance.

The wavelength conversion unit 87 employed in the present embodiment may be coupled in the same manner as that described above with reference to FIG. 1, unless otherwise mentioned.

In the present embodiment, as described above, the optical filter 88 is designed as a low pass filter, and it may be formed on a lower surface of the wavelength conversion unit 87 such that it is positioned between the wavelength conversion unit 87 and the light emitting device 85 as illustrated in FIG. 20. A change in an optical function and improvement effects according to such a disposition will be described later.

In the disposition, light generated by the light emitting device 85 may reach the wavelength conversion unit 87 through the wavelength selective optical filter 88.

The wavelength selective optical filter 88 may be formed to allow light $\lambda 1$ generated by the light emitting device 85 to be transmitted therethrough, while allowing light $\lambda 2$ converted by the wavelength conversion unit 87 to be reflected therefrom. Namely, the wavelength selective optical filter 88 may be considered as an optical low pass filter cutting off a band higher than the reference wavelength $\lambda c$. The wavelength selective optical filter 88 may be, for example, an omni-directional reflector (ODR) or a distributed Bragg reflector (DBR). In particular, in the present embodiment, the wavelength selective optical filter 18 may be a DBR.

The wavelength selective optical filter 88 may have a structure similar to that of the optical filter 18 illustrated in FIG. 1, basically operating as a low pass filter. Namely, as illustrated in FIG. 20, the optical filter 88 employed in the present embodiment may be implemented by alternately laminating first dielectric layers 88a having a predetermined refractive index and second dielectric layers 88b having a refractive index different from that of the first dielectric layer 88a. By appropriately adjusting the refractive indices, thicknesses, and the repeated amounts of laminations of the first and second dielectric layers 88a and 88b, the wavelength selective optical filter 88 may have desired transmittance and reflectivity together with desired wavelength selectivity.

In detail, in one embodiment, the first dielectric layer 88a may be made of $SiO_2$, $P_2O_5$, $B_2O_3$ alone or any combination thereof, and the second dielectric layer 88b may be made of $TiO_2$, $Ta_2O_5$, BaO, ZnO alone or any combination thereof, but the present inventive concept is not limited thereto. For example, five pairs to twenty pairs of first and second dielectric layers 88a and 88b may be iteratively formed. The wavelength selective optical filter 88 may have a thickness ranging, for example, from 0.5 µm to 5 µm.

The operation of the wavelength selective optical filter 88 coupled to the wavelength conversion unit 87 will be described.

Figure 21:
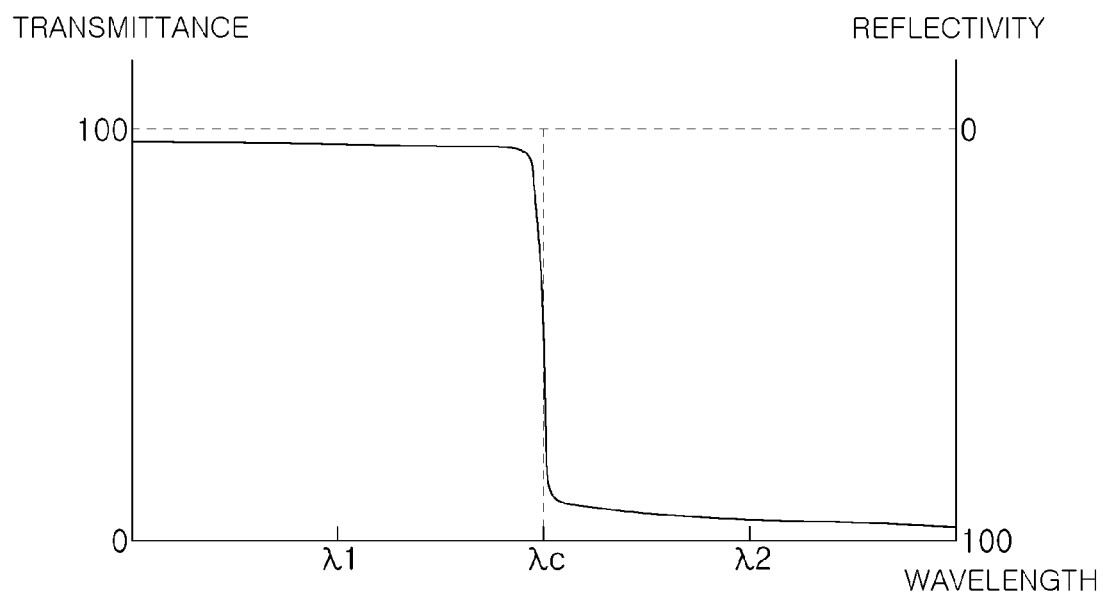
FIG. 21 is a graph schematically showing exemplary transmittance and reflectivity of a reflective layer employed in the fourth embodiment of the present disclosure.

Referring to FIGS. 20 and 21, the optical filter 88 serves as a low pass filter having a cutoff wavelength $\lambda c$ between primary light $\lambda 1$ emitted by the light emitting device and secondary light $\lambda 2$ wavelength converted by the wavelength conversion material P. Namely, the primary light $\lambda 1$ emitted by the light emitting device 85 may enter the wavelength conversion unit 87 through the optical filter 88, and may be converted into secondary light $\lambda 2$ having a different wavelength by the wavelength conversion material P. The primary light, in the process of being converted, causes scattering with the phosphor, and during the scattering process, the converted types of secondary light tend to enter again the light emitting device, as well as traveling in a desired light emission direction. However, the optical filter 88 may reflect the converted secondary light $\lambda 2$, rather than allowing it to be transmitted therethrough, to guide it in a desired direction.

In this manner, since the secondary light scattered by the wavelength conversion material P is prevented from traveling reversely by the optical filter to thus emit converted light in a desired direction, and as a result, conversion efficiency can be enhanced (improvement of luminance of converted light over usage of phosphor).

Such an embodiment may be advantageously used in a light emitting device package for white light, as well as in a light emitting device package for monochromatic light.

For example, in a case in which the light emitting device 85 is a blue light emitting device and a wavelength conversion material is a yellow phosphor, when a cutoff wavelength $\lambda c$ of the wavelength selective optical filter 88 is designed as a certain wavelength within a range of 480 nm to 600 nm therebetween, the wavelength selective optical filter 88 may be able to effectively guide scattered yellow light in a desired direction. Through this operation, a high degree of conversion efficiency can be guaranteed even with the relatively small content of wavelength conversion material.

As illustrated, the optical filter 88 employed in the present embodiment may be applied to the surface of the wavelength conversion unit 87. In this case, in order to prevent a generation of optical noise between the optical filter 88 and the wavelength conversion unit 87, the optical filter 88 may be directly formed on the surface of the wavelength conversion unit 87. For example, in the present embodiment, when the optical filter 88 is provided as a material that can be deposited, like a dielectric layer, the optical filter 88 may be directly deposited on the surface of the wavelength conversion unit 87.

In this manner, since the optical filter 88 and the wavelength conversion unit 87 are coupled through a direct deposition process, a disadvantageous optical influence in the interface between the optical filter 88 and the wavelength conversion unit 87 can be excluded. If necessary, for the purpose of the deposition process, the surface of the wavelength conversion unit 87 may be planarized or smoothened through a polishing process. In this manner, the wavelength conversion unit 87 and the optical filter 88 may be manufactured as a single sheet and the sheet may be cut to fit a region to which the sheet is to be applied, and attached thereto.

In the present embodiment, since the wavelength conversion unit 87 is exposed to the outside, the wavelength conversion material P such as a phosphor or a quantum dot of the wavelength conversion unit 87 may be oxidized or hydroscopic moisture may infiltrate into the wavelength conversion unit 87. Thus, in order to prevent a degradation of reliability due to this, a light-transmissive protective layer (not shown) may be additionally formed on an upper surface of the wavelength conversion unit 87. As the light-transmissive protective layer, the optical filter as a high pass filter as described above may be employed. The semiconductor light emitting device in which an optical filter is additionally formed as a protective layer on an upper surface of the wavelength conversion unit may be used mainly as a light emitting device package for monochromatic light.

In the embodiment illustrated in FIG. 20, the wavelength conversion unit 87 is disposed above the recess portion R of the package, but the wavelength conversion unit 87 may also be provided in any other appropriate position as long as it is placed in a light emitting path. The position of the wavelength conversion unit 87 may be variously modified.

In addition, as well as being positioned on a structure other than a light emitting device, the wavelength conversion unit may also be provided on a surface of a light emitting device. This embodiment is illustrated in FIG. 22.

Figure 22:
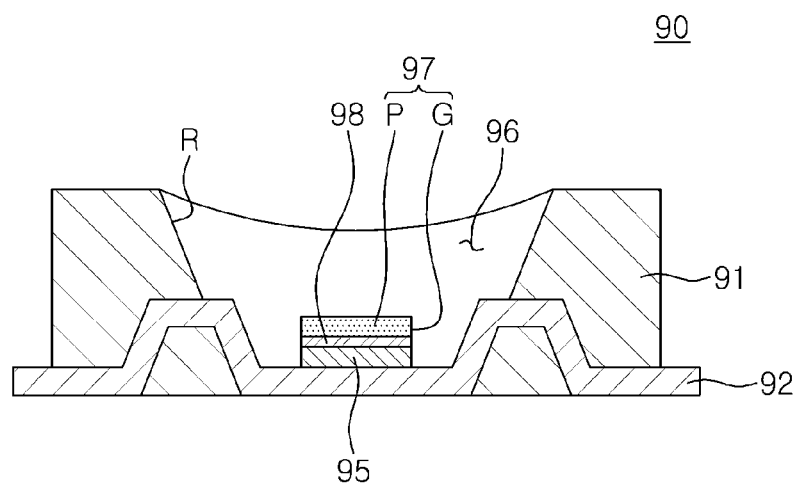
FIG. 22 is a cross-sectional view of a semiconductor light emitting device package according to a fifth exemplary embodiment of the present disclosure.

A light emitting device package 90 illustrated in FIG. 22 includes a package body 91, a light emitting device 95, a wavelength conversion unit 97, and an optical filter 98.

The package body 91 employed in the present embodiment may have a recess portion R with an open upper portion, similar to that of the package body 11 illustrated in FIG. 1. Also, one lead frame (not shown) and another lead frame 92 may be coupled by the package body 91, and may be partially exposed through the recess portion R.

The light emitting device 95 is mounted on the lead frame 92, and a transparent layer, such as transparent resin unit 96 may be provided in the recess portion R to cover the light emitting device 95. In one embodiment, the structures of the package body 91 and the lead frame 92 and the connection scheme of the light emitting device 95 as described above may be variously modified.

The wavelength conversion unit 97 may be positioned on a path along which light from the light emitting device 95 is emitted. In the present embodiment, the wavelength conversion unit 97 may be positioned on a surface of the light emitting device 95.

The wavelength conversion unit 97 may be formed, for example, as a sintered body of a mixture containing a wavelength conversion material P and a glass material G. The wavelength conversion material P may be various phosphors such as an inorganic phosphor, or a quantum dot. The glass material G may serve as a matrix of the wavelength conversion unit 97 or a binder of the wavelength conversion material P. As the glass material G, a material, able to be fired at low temperatures such that the wavelength conversion material P cannot be degraded at high temperatures, as well as securing a high degree of light transmittance, may be used. In the present embodiment, the wavelength selective optical filter 98 is formed on a lower surface of the wavelength conversion unit 97 (e.g., a surface opposite the surface that faces the outside of the light emitting semiconductor package device 90. The wavelength conversion unit 97 and the optical filter 98 employed in the present embodiment may be coupled, for example, in the same manner as that described above with reference to FIG. 1, unless otherwise mentioned.

The wavelength conversion unit 97 and the optical filter 98 may be manufactured as a single sheet and attached to a surface of the light emitting device 95 to which they are to be applied, respectively, but the present inventive concept is not limited thereto. The laminate of the conversion unit 97 and the optical filter 98 manufactured as a single sheet, respectively, may be cut to have a design appropriate for the surface of the light emitting device 95. This may be understood with reference to the examples described above with reference to FIGS. 5 and 6. Such an attachment process may also be implemented in a wafer level, rather than an individual light emitting device chip unit.

Also, in the present embodiment, similarly to the embodiment illustrated in FIG. 20, the wavelength selective optical filter 98 formed on a lower surface of the wavelength conversion unit 97 allows light generated by the light emitting device 95 to be transmitted therethrough to travel to the wavelength conversion unit 97, and allows light entering the interior, included in converted light scattered by the wavelength conversion material P, to be reflected in a desired light emission direction, thus enhancing overall light conversion efficiency. Thus, according to the present embodiment, in order to obtain converted light under the same conditions, a relatively small amount of wavelength conversion material may be used.

Although not shown, a resin containing light-reflective powder additionally applied to the lateral surfaces of the light emitting device 95 or any other region of the package may also be used as necessary. As the light-reflective powder, powder such as $TiO_2$ or $Al_2O_3$ may be used.

A plurality of wavelength conversion materials converting light into light having different peak wavelengths may be employed. Namely, various wavelength conversion materials such as a plurality of phosphors, a plurality of quantum dots, or a combination thereof, emitting light having different colors may also be used. In this embodiment, in case of implementing white light, color rendering higher than that of a configuration using a single type of wavelength conversion material is used. This embodiment is illustrated in FIG. 23.

Figure 23:
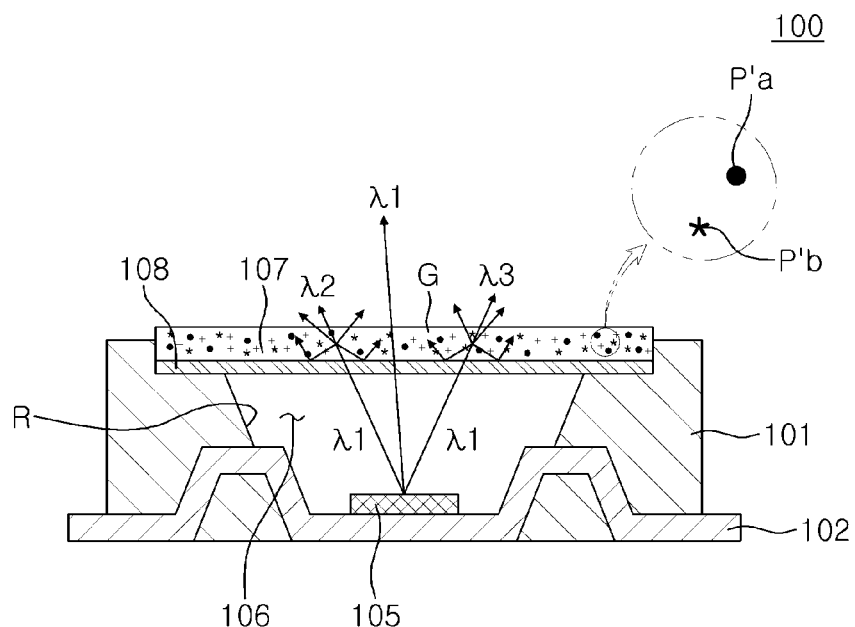
FIG. 23 is a cross-sectional view of a semiconductor light emitting device package according to a sixth exemplary embodiment of the present disclosure.

A semiconductor light emitting device package 100 illustrated in FIG. 23 includes a package body 101, a light emitting device 105, a wavelength conversion unit 107, and an optical filter 108.

The package body 101 employed in the present embodiment may have a recess portion R with an open upper portion, like the package body of the former embodiment. Also, one lead frame (not shown) and another lead frame 102 may be coupled by the package body 101, and may be partially exposed through the recess portion R.

The light emitting device 105 is mounted on the lead frame 102, and a transparent resin unit 106 may be provided in the recess portion R to cover the light emitting device 105. In one embodiment, the structures of the package body 101 and the lead frame 102 and the connection scheme of the light emitting device 105 as described above may be variously modified.

The wavelength conversion unit 107 may be provided in an upper end of the recess portion R so as to be positioned on a path along which light from the light emitting device 105 is emitted. In the present embodiment, the wavelength conversion unit 107 may be formed as a sintered body of a mixture containing two types of wavelength conversion materials Pa' and Pb' and a glass material G.

The wavelength conversion materials Pa' and Pb' may be two types of wavelength conversion materials selected from various phosphors such as an inorganic phosphor, or a quantum dot. The two wavelength conversion materials Pa' and Pb' employed in the present embodiment may be materials selected to implement white light emission.

As the glass material G, a material, able to be fired at low temperatures such that the wavelength conversion materials Pa' and Pb' cannot be degraded at high temperatures, as well as securing a high degree of light transmittance, may be used.

The wavelength conversion unit 107 and the optical filter 108 employed in the present embodiment may be coupled in the same manner as that described above with reference to FIG. 1, unless otherwise mentioned.

Also, in the present embodiment, similarly to the embodiment illustrated in FIG. 20, the wavelength selective optical filter 108 is formed on a lower surface of the wavelength conversion unit 107. The wavelength selective optical filter 108 formed on the lower surface of the wavelength conversion unit 107 may allow light to be selectively transmitted or reflected according to wavelengths.

Namely, the light emitting device 105 emits primary light (having a peak wavelength of λ1) provided as excitation light. The primary light is converted into two types of secondary light (having peak wavelengths λ2 and λ3) having different wavelengths by the two phosphors Pa' and Pb' of the wavelength conversion unit 107. The converted two types of secondary light have a long wavelength, relative to the primary light. Here, the optical filter 108 is designed as a low pass filter having a cutoff wavelength between the wavelength λ1 of the primary light and the wavelength λ2 of light, having the shortest wavelength, among the types of secondary light.

Figure 24:
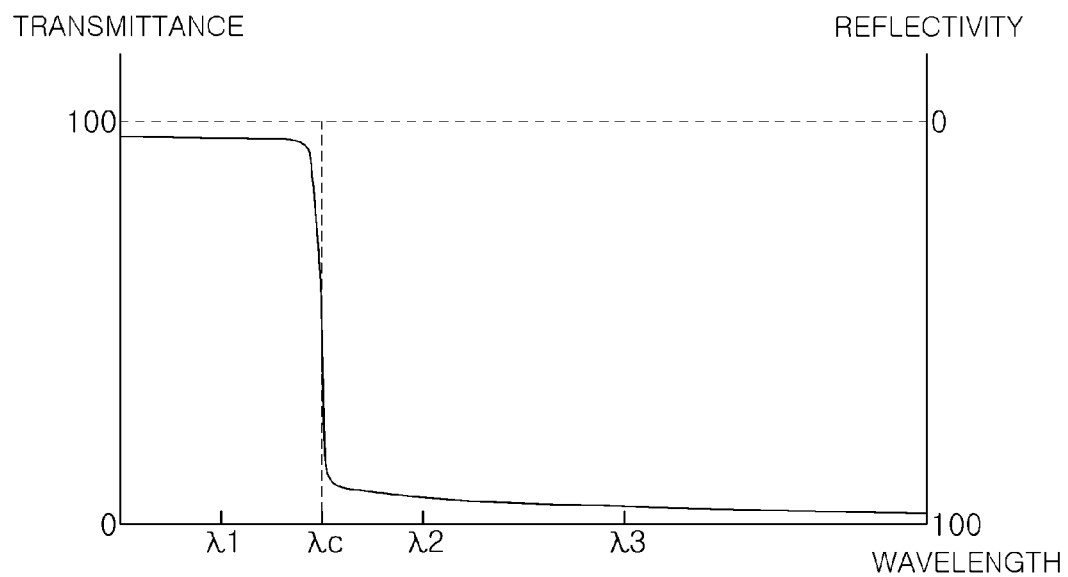
FIG. 24 is a graph schematically showing exemplary transmittance and reflectivity of a reflective layer employed in the sixth embodiment of the present disclosure.

Thus, as illustrated in FIG. 24, the optical filter 108 allows the primary light (having the peak wavelength of λ1) emitted from the light emitting device 105 to be transmitted therethrough to travel to the wavelength conversion unit 107, and a partial amount of light not traveling in the light emission direction due to scattering, among the types of light converted in the wavelength conversion unit 107, is reflected by the optical filter 108 so as to travel in a desired light emission direction. Through this process, the overall light conversion efficiency can be enhanced.

In the present embodiment, unlike the former embodiment, two types of different phosphors Pa' and Pb' are used in the wavelength conversion unit 107. Primary light emitted from the light emitting device 105 may be converted into a plurality of types of secondary light having different wavelength bands by the phosphors Pa' and Pb', and white light may be implemented through a combination of primary light emitted without being converted and the plurality of types of secondary light.

For example, desired white light may be provided by selecting blue light as primary light generated by the light emitting device 105 and selecting two phosphors as wavelength conversion materials, as green and red phosphors.

Meanwhile, combinations of the wavelength conversion materials such as phosphors may be variously implemented. In another example, a yellow phosphor may be used as a main wavelength conversion material and at least one of green, orange, and red phosphors may be additionally combined thereto in order to improve color rendering and adjust a color temperature.

Also, the wavelength conversion unit 107 and the optical filter 108 may be manufactured as a single sheet and subsequently attached to the package body 101 to cover the recess portion R.

In a configuration in which the optical filter is designed as an optical low pass filter, the wavelength conversion units and the optical filters may be alternately laminated repeatedly a plurality of times. This embodiment is illustrated in FIG. 25.

Figure 25:
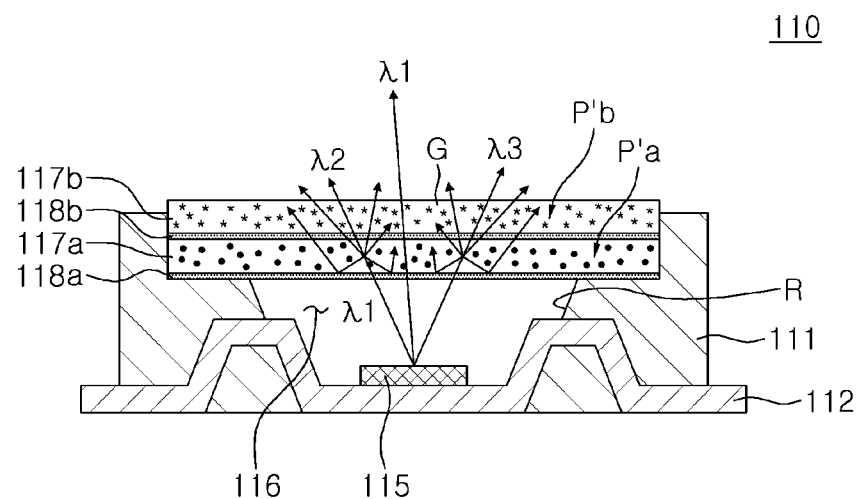
FIG. 25 is a cross-sectional view of a semiconductor light emitting device package according to a seventh exemplary embodiment of the present disclosure.

A semiconductor light emitting device package 110 illustrated in FIG. 25 includes a package body 111, a light emitting device 115, first and second wavelength conversion units 117a and 117b, and first and second optical filters 118a and 118b.

The package body 111 employed in the present embodiment may have a recess portion R with an open upper portion, like the package body of the former embodiment. Also, one lead frame (not shown) and another lead frame 112 may be coupled by the package body 111, and may be partially exposed through the recess portion R.

The light emitting device 115 is mounted on the lead frame 112, and a transparent resin unit 116 may be provided in the recess portion R to cover the light emitting device 115.

In the present embodiment, the structures of the package body 111 and the lead frame 112 and the connection scheme of the light emitting device 115 as described above may be variously modified.

As illustrated in FIG. 25, the first wavelength conversion unit 117a includes a first wavelength conversion material Pa' and may be configured as a sintered body of a mixture containing the first wavelength conversion material Pa' and a glass material G. The second wavelength conversion unit 117b includes a second wavelength conversion material Pb' different from the first wavelength conversion material Pa' and may be configured as a sintered body of a mixture containing the second wavelength conversion material Pb' and the glass material G. Here, the glass material G used in the first and second wavelength conversion units 117a and 117b are illustrated to have the same composition, but the first and second wavelength conversion units 117a and 117b may have different compositions, as necessary. The first and second wavelength selective optical filters 118a and 118b are formed on lower surfaces of the first and second wavelength conversion units 117a and 117b, respectively.

The first and second wavelength selective optical filters 118a and 118b employed in the present embodiment are configured to allow light generated by the light emitting device 115 and light, wavelength converted by the wavelength conversion materials of the wavelength conversion units positioned therebelow, to be transmitted therethrough and reflect light, wavelength converted by the wavelength conversion materials of the wavelength conversion units positioned thereabove, respectively. For example, the first wavelength selective optical filter 118a may be configured to allow light generated by the light emitting device 115 to be transmitted therethrough and reflects light converted by the first wavelength conversion material Pa' of the first wavelength conversion unit 117a, and the second wavelength selective optical filter 118b may be configured to allow light generated by the light emitting device 115 and light converted by the first wavelength conversion material Pa' to be transmitted therethrough and reflect light converted by the first wavelength conversion material Pb' of the second wavelength conversion unit 117b.

In detail, the light emitting device 115 emits primary light (having a peak wavelength of λ1) provided as excitation light. The primary light is converted into two types of secondary light (having peak wavelengths λ2 and λ3) having different wavelengths by the two phosphors Pa' and Pb' of the first and second wavelength conversion units 117a and 117b. The converted types of secondary light have a long wavelength, relative to the primary light.

Here, the first optical filter 118a may be designed as a low pass filter having a cutoff wavelength λc1 positioned between the wavelength λ1 of the primary light and the wavelength λ2 of light, having the shortest wavelength, among the types of secondary light, and the second optical filter 118b may be designed as a low pass filter having a cutoff wavelength λc2 positioned between the two types of secondary light.

Figure 26:
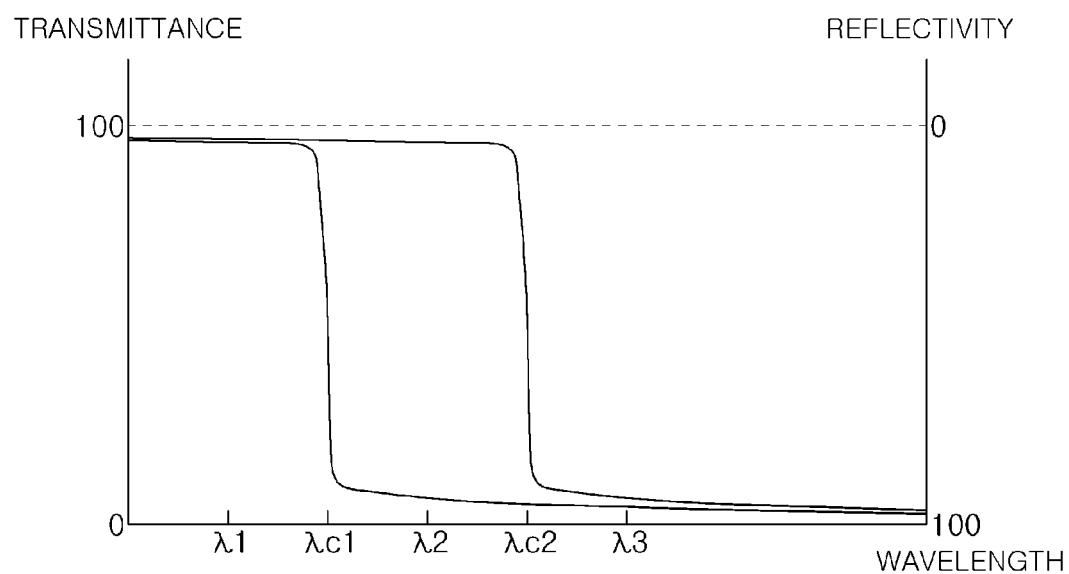
FIG. 26 is a graph schematically showing exemplary transmittance and reflectivity of a reflective layer employed in the seventh embodiment of the present disclosure.

Thus, as illustrated in FIG. 26, the first optical filter 118a allows the primary light (having the peak wavelength λ1) emitted from the light emitting device 115 to be transmitted therethrough to travel to the first wavelength conversion unit 117a, and a partial amount of light not traveling in the light emission direction due to scattering, among types of light converted in the first wavelength conversion unit 117a, is reflected by the first optical filter 118a so as to travel to the second wavelength conversion unit 117b. The second optical filter 118b allows the primary light (having the peak wavelength of λ1) emitted from the light emitting device 105 and secondary light (having the peak wavelength λ2) converted in the first wavelength conversion unit 117a to be transmitted therethrough to travel to the second wavelength conversion unit 117b, and a partial amount of light, not traveling in the light emission direction due to scattering, included in light (having the peak wavelength λ3) converted in the second wavelength conversion unit 117b, is reflected by the second optical filter 118b so as to be emitted to the outside (in a desired light emission direction). Through this process, the overall light conversion efficiency can be enhanced. Also, white light having desired characteristics can be implemented through a combination of primary light emitted without being converted and the plurality of types of secondary light.

For example, desired white light may be provided by selecting blue light as primary light generated by the light emitting device 105 and selecting two phosphors as the first and second wavelength conversion materials Pa' and Pb', as green and red phosphors.

Combinations of the wavelength conversion materials such as phosphors may be variously implemented. In another example, a yellow phosphor may be used as a main wavelength conversion material and at least one of green, orange, and red phosphors may be additionally combined thereto in order to improve color rendering and adjust a color temperature.

The first and second wavelength conversion units 117a and 117b and the first and second wavelength selective optical filters 118a and 118b may be combined in the same manner as described above with reference to FIG. 1.

Also, the first wavelength conversion unit 117a and the first optical filter 118a or the second wavelength conversion unit 117b and the second optical filter 118b may be manufactured as a single sheet and attached to the package body 71, respectively, to cover the recess portion R, as necessary.

Figure 27:
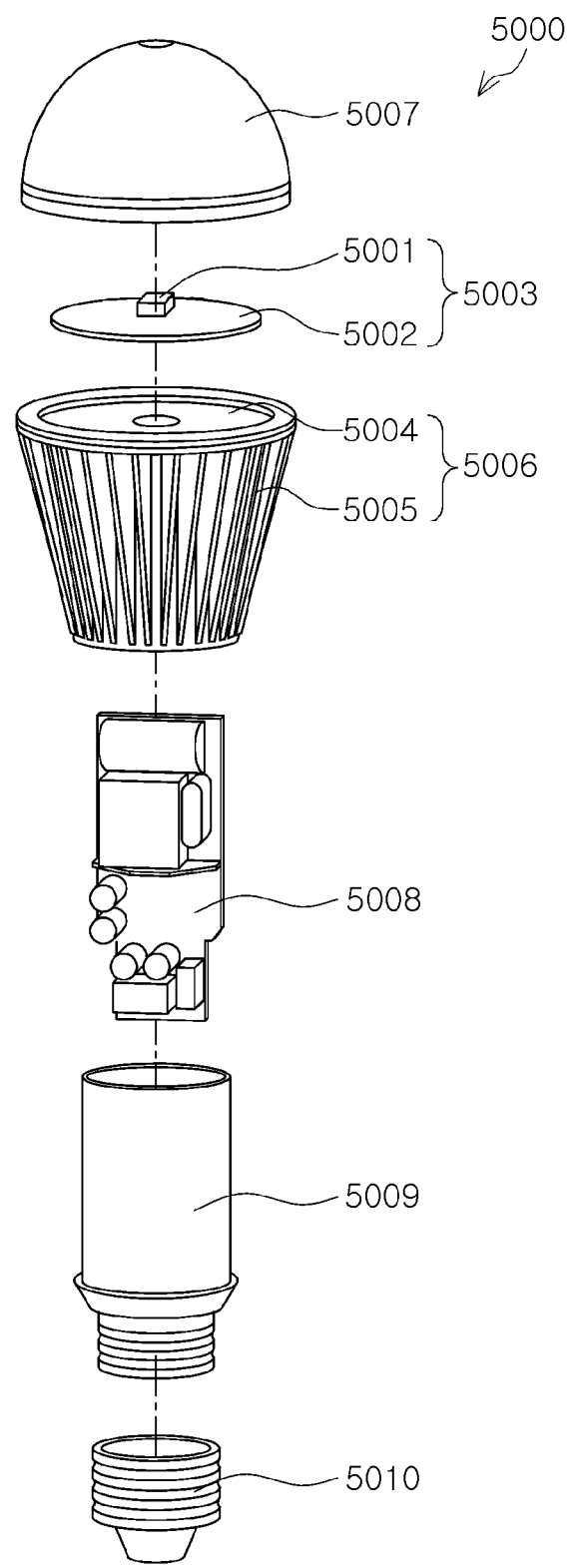
FIG. 27 is an exploded perspective view illustrating an example of a lighting device in which the foregoing semiconductor light emitting device is employable according to one exemplary embodiment of the present disclosure.
Figure 28:
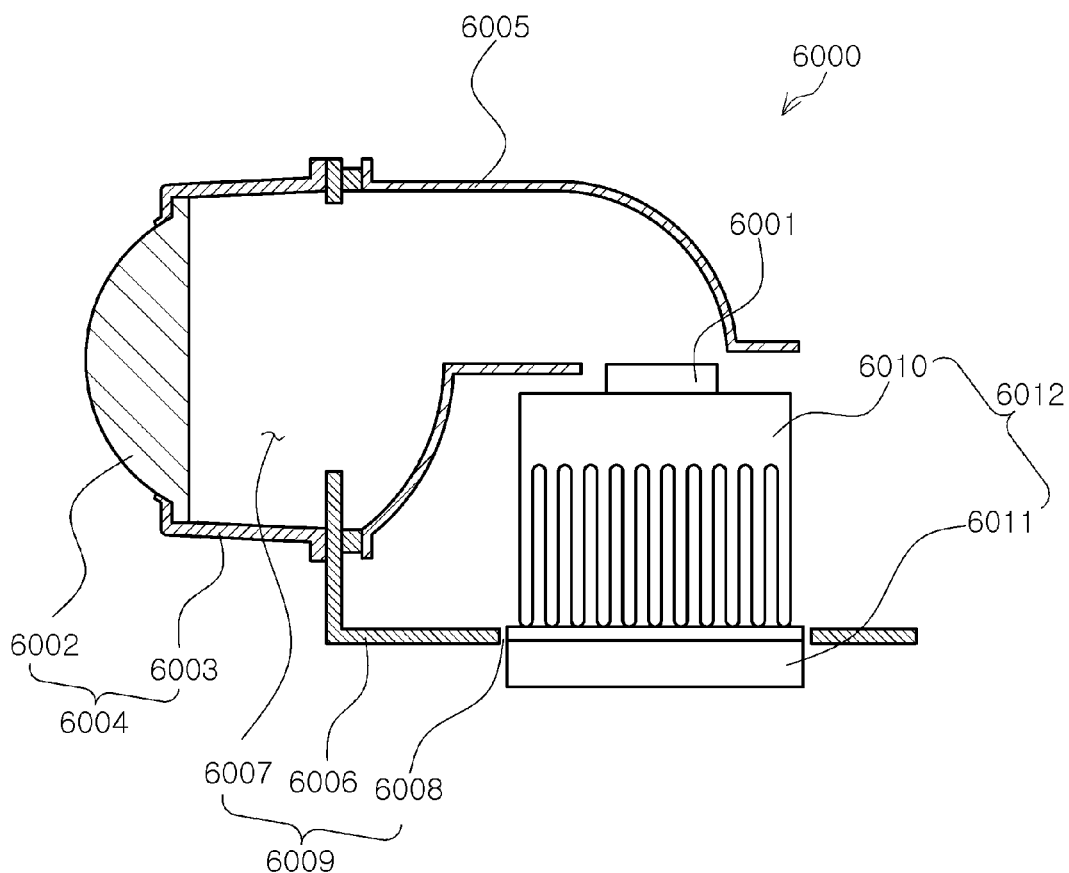
FIG. 28 is a schematic cross-sectional view illustrating an example of a head lamp in which the foregoing semiconductor light emitting device is employable according to an exemplary embodiment of the present disclosure.

The semiconductor light emitting device package according to the foregoing embodiments may be advantageously applied to various applications. FIGS. 27 and 28 illustrate a lighting device and a head lamp as application examples.

FIG. 27 is an exploded perspective view illustrating an example of a lighting device employing the foregoing semiconductor light emitting device according to certain embodiments of the present disclosure A lighting device 5000 illustrated in FIG. 27 is, for example, a bulb-type lamp including a light emitting module 5003, a driving unit 5008, and an external connection unit 5010. Also, the lighting device 5000 may further include external structures such as external and internal housings 5006 and 5009 and a cover unit 5007. The light emitting module 5003 may have the foregoing semiconductor light emitting device package 5001 and a circuit board 5002 with the light emitting device package 5001 mounted thereon.

In the present embodiment, it is illustrated that a single semiconductor light emitting device package 5001 is mounted on the circuit board 5002, but the present inventive concept is not limited thereto and a plurality of semiconductor light emitting device packages may be mounted.

Also, in the lighting device 5000, the light emitting module 5003 may include the external housing 5006 serving as a heat dissipation unit, and in this case, the external housing 5006 may include a heat dissipation plate 5004 disposed to be directly in contact with the light emitting module 5003 to enhance heat dissipation effect. Also, the lighting device 5000 may include the cover unit 5009 installed on the light emitting module 5003 and having a convex lens shape. The driving unit 5008 is installed in the internal housing 5009 and connected to the external connection unit 5010 having a socket structure to receive power from an external power source.

Also, the driving unit 5008 may serve to convert power into an appropriate current source for driving the semiconductor light emitting device 5001 of the light emitting mode 5003, and provide the same. For example, the driving unit 5008 may be configured as an AC-DC converter, a rectifying circuit component, or the like.

Thus, the semiconductor light emitting device package according to the foregoing embodiment, in particular, the semiconductor light emitting device package according to an embodiment providing white light may be advantageously applied to the lighting device illustrated in FIG. 27.

FIG. 28 is a schematic cross-sectional view illustrating an example of a head lamp employing the foregoing semiconductor light emitting device according to another embodiment of the present disclosure.

Referring to FIG. 28, a head lamp 6000 used, for example, as a vehicle headlamp, or the like, may include a light source 6001, a reflective unit 6005, and a lens cover unit 6004. The lens cover unit 6004 may include a hollow guide 6003 and a lens 6002. Also, the head lamp 6000 may further include a heat dissipation unit 6012 dissipating heat generated by the light source 6001 outwardly.

In order to effectively dissipate heat, the heat dissipation unit 6012 may include a heat sink 6010 and a cooling fan 6011. Also, the headlamp 6000 may further include a housing 6009 fixedly supporting the heat dissipation unit 6012 and the reflective unit 6005, and the housing 6009 may have a central hole 6008 formed on one surface thereof, in which the heat dissipation unit 6012 is coupled. Also, the housing 6009 may have a front hole 6007 formed on the other surface integrally connected to the one surface and bent in a right angle direction. The front hole 6007 may allow the reflective unit 6005 to be fixedly positioned above the light source 6001. Accordingly, a front side is opened by the reflective unit 6005, and the reflective unit 6005 is fixed to the housing 6009 such that the opened front side corresponds to the front hole 6007, and light reflected by the reflective unit 6005 may pass through the front hole 6007 so as to be output outwardly.

Accordingly, a monochromatic (in particular, orange) head lamp having a high degree of color purity can be implemented by applying the semiconductor light emitting device package according to an embodiment of the present disclosure to the head lamp. Also, a desired white head lamp may be implemented by using any other wavelength conversion material emitting white light or a combination of wavelength conversion materials.

As set forth above, according to embodiments of the disclosure, a semiconductor light emitting device package capable of effectively emitting light having excellent color purity, excellent efficiency, and light having a desired color can be provided. In the semiconductor light emitting device package implementing white light, an amount of actually used wavelength conversion material can be reduced by enhancing conversion efficiency, and a disadvantageous influence due to scattering with a wavelength conversion material can be reduced.

While the present disclosure has been shown and described in connection with the embodiments, it will be apparent to those skilled in the art that modifications and variations can be made without departing from the spirit and scope of the inventive concept as defined by the appended claims.

What is claimed is:

1. A semiconductor light emitting device package comprising:
a light emitting device;
a first wavelength conversion unit positioned on a path along which light generated by the light emitting device travels and configured as a sintered body of a mixture including a first wavelength conversion material and a first glass material;
a first wavelength selective optical filter disposed on a first surface of the wavelength conversion unit, allowing one of light generated by the light emitting device and light having a wavelength converted by the first wavelength conversion material to be transmitted therethrough and reflecting the other of the light generated by the light emitting device and the light having the wavelength converted by the first wavelength conversion material;
a second wavelength conversion unit positioned above the first wavelength conversion unit on the path along which the light generated by the light emitting device travels and configured as a sintered body of a mixture containing a second wavelength conversion material and a second glass material; and
a second wavelength selective optical filter disposed on a lower surface of the second wavelength conversion unit, allowing light generated by the light emitting device to be transmitted therethrough and reflecting light having a second wavelength converted by the second wavelength conversion material,
wherein each of the first and second wavelength selective optical filters allows light generated by the light emitting device to be transmitted therethrough, and wavelengths converted by the first and second wavelength conversion materials of the respective first and second wavelength conversion units positioned thereabove, and
wherein the second wavelength selective optical filter additionally allows light converted by the first wavelength conversion material to be transmitted therethrough.

2. The semiconductor light emitting device package of claim 1, wherein light generated by the light emitting device is blue light, and the first wavelength conversion material includes a yellow phosphor.

3. The semiconductor light emitting device package of claim 1, wherein the first wavelength conversion material includes a plurality of phosphors converting light into light having different peak wavelengths.

4. The semiconductor light emitting device package of claim 2, wherein colors of light emitted from the first wavelength conversion unit are mixed to provide white light.

5. The semiconductor light emitting device package of claim 1, wherein colors of light emitted from the first and second wavelength conversion units are mixed to provide white light.

6. A semiconductor light emitting device package, comprising:
a light emitting device configured to generate light;
a wavelength conversion unit positioned on a path along which the light generated by the light emitting device travels and formed as a mixture containing a wavelength conversion material and a glass material; and
a wavelength selective optical filter disposed on and contacting a first surface of the wavelength conversion unit, and configured to reflect light incident on the wavelength selective optical filter from one of the light emitting device and the wavelength conversion unit, and to transmit light incident on the wavelength selective optical filter from the other of the light emitting device and the wavelength conversion unit,
wherein the glass material is a glass composition including 30 wt % to 60 wt % of ZnO—BaO, 10 wt % to 30 wt % of $B_2O_3$, 5 wt % to 20 wt % of $P_2O_5$, and including at least one selected from the group consisting of $Na_2O$, CaO, $K_2O$, and $Li_2O$ at an amount equal to or less than 20 wt %.

7. The semiconductor light emitting device package of claim 6 wherein:
the wavelength conversion unit is a sintered body positioned between the light emitting device and the filter.

8. The semiconductor light emitting package of claim 6,
wherein the wavelength selective optical filter is positioned between the light emitting device and the wavelength conversion unit,
wherein the light generated by the light emitting device is a first light,
wherein light converted by the wavelength conversion light is a second light that when combined with the first light generates a white light, and
wherein the wavelength selective optical filter allows an amount of the first light to pass through, so that light exiting the semiconductor light emitting package is white light.

9. The semiconductor light emitting device package of claim 6, wherein the wavelength selective optical filter is formed by alternately laminating two types of dielectric layers having different refractive indices.

10. The semiconductor light emitting device package of claim 6,
wherein the wavelength selective optical filter is positioned at an upper surface of the wavelength conversion unit, and
wherein the wavelength selective optical filter reflects light generated by the light emitting device and allows light having a wavelength converted by the wavelength conversion material to be transmitted therethrough.

11. The semiconductor light emitting device package of claim 10,
wherein the wavelength conversion material includes an orange phosphor, and
wherein the wavelength selective optical filter reflects light having a wavelength band lower than a reference wavelength and allows light having a wavelength band equal to or higher than the reference wavelength to be transmitted therethrough, wherein the reference wavelength is in the range of about 500 nm to about 550 nm.

* * * * *